(12) United States Patent
Lin et al.

(10) Patent No.: US 12,119,073 B2
(45) Date of Patent: Oct. 15, 2024

(54) INTEGRATED CIRCUIT AND OPERATION METHOD AND INSPECTION METHOD THEREOF

(71) Applicant: ASPEED Technology Inc., Hsinchu (TW)

(72) Inventors: Hung-Ming Lin, Hsinchu (TW); Hung-Ju Huang, Hsinchu (TW)

(73) Assignee: ASPEED Technology Inc., Hsinchu (TW)

( * ) Notice: Subject to any disclaimer, the term of this patent is extended or adjusted under 35 U.S.C. 154(b) by 241 days.

(21) Appl. No.: 17/883,607

(22) Filed: Aug. 9, 2022

(65) Prior Publication Data
US 2023/0377676 A1    Nov. 23, 2023

(30) Foreign Application Priority Data
May 23, 2022   (TW) .................................. 111119043

(51) Int. Cl.
| | | |
|---|---|---|
| *G11C 29/52* | (2006.01) | |
| *G06F 7/58* | (2006.01) | |
| *G11C 7/10* | (2006.01) | |
| *G11C 29/02* | (2006.01) | |

(52) U.S. Cl.
CPC ............. *G11C 29/52* (2013.01); *G06F 7/58* (2013.01); *G11C 7/1039* (2013.01); *G11C 29/022* (2013.01)

(58) Field of Classification Search
CPC ..... G11C 29/52; G11C 7/1039; G11C 29/022; G11C 17/16; G11C 17/18; G11C 29/42; G11C 2029/4402; G11C 2029/5002; G06F 7/58
USPC ..................................................... 365/185.09
See application file for complete search history.

(56) References Cited

U.S. PATENT DOCUMENTS

| | | |
|---|---|---|
| 7,482,657 B1 | 1/2009 | Lucero |
| 8,677,144 B2 | 3/2014 | Haider et al. |
| 8,918,575 B2 | 12/2014 | Markey et al. |
| 2011/0002461 A1 | 1/2011 | Erhart et al. |

(Continued)

FOREIGN PATENT DOCUMENTS

| | | |
|---|---|---|
| TW | M396434 | 1/2011 |
| TW | I697907 | 7/2020 |

*Primary Examiner* — Hoai V Ho
(74) *Attorney, Agent, or Firm* — JCIPRNET

(57) ABSTRACT

The disclosure provides an integrated circuit and an operation method and an inspection method thereof. The integrated circuit includes a one-time programmable (OTP) memory, an identifier generation circuit, and a memory controller. The identifier generation circuit generates a random number, and performs an error-detection-code encoding operation on the random number to generate an identifier with an error-detection code. The memory controller writes the identifier generated by the identifier generation circuit into the OTP memory. The identifier generation circuit reads the identifier from the OTP memory through the memory controller, and performs an error-detection-code decoding operation on the identifier provided by the memory controller to determine whether an error of the identifier from the OTP memory is correctable. When it is determined that the error of the identifier from the OTP memory is not correctable, the writing of the identifier is deemed failed.

31 Claims, 18 Drawing Sheets

(56) References Cited

U.S. PATENT DOCUMENTS

| | | | |
|---|---|---|---|
| 2014/0215294 A1* | 7/2014 | Kim | G11C 17/146 |
| | | | 714/819 |
| 2018/0270014 A1* | 9/2018 | Muratani | H04L 9/0866 |
| 2022/0139485 A1* | 5/2022 | Kim | G11C 29/14 |
| | | | 714/719 |

* cited by examiner

INTEGRATED CIRCUIT AND OPERATION METHOD AND INSPECTION METHOD THEREOF

CROSS-REFERENCE TO RELATED APPLICATION

This application claims the priority benefit of Taiwan application Ser. No. 111119043, filed on May 23, 2022. The entirety of the above-mentioned patent application is hereby incorporated by reference herein and made a part of this specification.

BACKGROUND

Technical Field

The disclosure relates to an integrated circuit, and more particularly, to an integrated circuit having characteristics equivalent to a Physically Unclonable Function (PUF), and an operation method and an inspection method thereof.

Description of Related Art

Physically unclonable function (PUF) refers to a hardware security technology, for generating a unique identifier for any integrated circuit, which is used as a private key to identify the integrated circuit. The identifier of the integrated circuit is similar to a "fingerprint." The fingerprint is unique, unreplicable and is integrated with the integrated circuit as one, and it is impossible to create another integrated circuit with the same fingerprint as other integrated circuits. Generally speaking, process variations are uncontrollable, unpredictable, and unreplicable. Based on such process variations, the integrated circuit with the PUF can generate the identifier unique to a device, which is so used to authenticate the device (integrated circuit).

It should be noted that the content of the "Description of Related Art" is used to help understand the present disclosure. Some or all the content disclosed in the "Description of Related Art" may not be common knowledge known to those skilled in the art. The content disclosed in the "Description of Related Art" is not to be taken that it is already known to those skilled in the art.

SUMMARY

The disclosure provides an integrated circuit and an operation method and an inspection method thereof, to generate a unique identifier of the integrated circuit and/or inspect whether the identifier of the integrated circuit is valid (correctable).

According to an embodiment of the disclosure, the integrated circuit includes a one-time programmable (OTP) memory, an identifier generation circuit, and a memory controller. The identifier generation circuit generates a random number, and performs an error-detection-code encoding operation on the random number to generate an identifier with an error-detection code. The identifier generation circuit includes a weight counter to calculate a weight of the random number and inspect the weight. When the weight falls within a proportional range, the identifier generation circuit performs an error-detection-code encoding operation on the random number to generate the error-detection code. When the weight falls outside the proportional range, the identifier generation circuit regenerates the random number until the weight of the random number falls within the proportional range. The memory controller is coupled to the OTP memory and the identifier generation circuit. The memory controller writes the identifier generated by the identifier generation circuit into the OTP memory.

According to an embodiment of the disclosure, the operation method includes: generating a random number; calculating a weight of the random number; inspecting the weight of the random number; when the weight falls outside a proportional range, regenerating the random number until the weight of the random number falls within the proportional range; when the weight falls within the proportional range, performing an error-detection-code encoding operation on the random number to generate an identifier with an error-detection code; and writing the identifier into an OTP memory of an integrated circuit.

According to an embodiment of the disclosure, the inspection method includes: reading an identifier with an error-detection code from an OTP memory of an integrated circuit; and performing an error-detection-code decoding operation on the identifier to determine whether an error of the identifier from the OTP memory is correctable.

Based on the above, the integrated circuit and the operation method thereof according to some embodiments of the disclosure perform the error-detection-code encoding operation on a random number to generate an error-detection code. In some embodiments, the error-detection code includes an error-correcting code (ECC) or a Hamming code with additional parity. The identifier with the error-detection code is written into the OTP memory of the integrated circuit. In addition, the integrated circuit inspects whether the identifier from the OTP memory is valid (is correctable). When the error of the identifier from the OTP memory is not correctable, the writing of the identifier is deemed failed, so the integrated circuit can be discarded.

In order to make the above-mentioned features and advantages of the disclosure clearer and easier to understand, the following embodiments are given and described in details with accompanying drawings as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
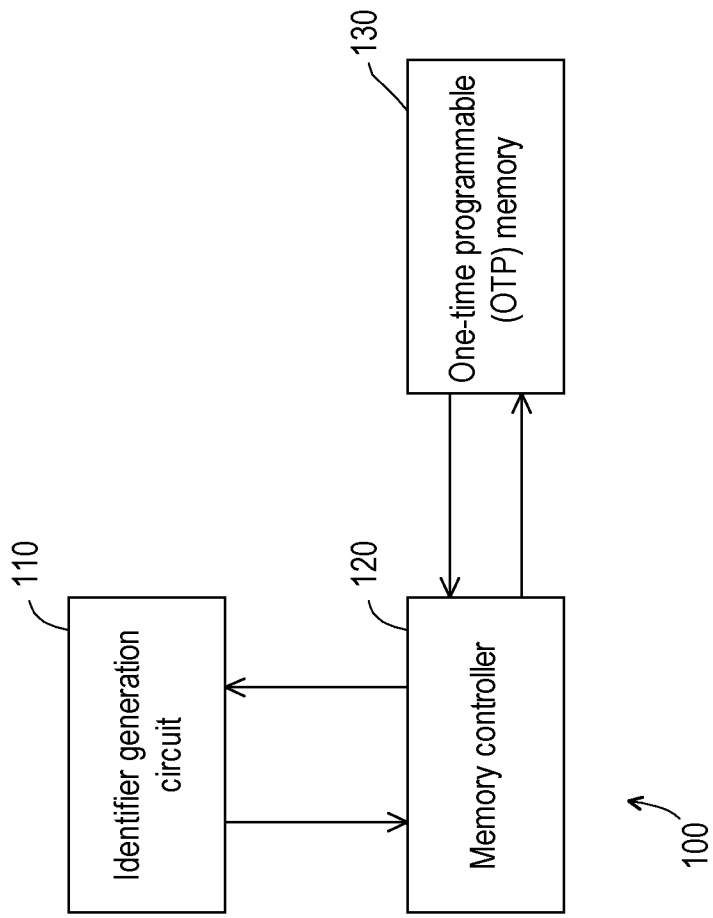
FIG. 1 is a schematic circuit block diagram of an integrated circuit according to an embodiment of the disclosure.

The term "coupled (or connected)" used throughout this specification (including the claims) refers to any direct or indirect means of connection. For example, if a first device is described as being coupled (or connected) to a second device, it should be interpreted that the first device may be directly connected to the second device, or the first device may be indirectly connected to the second device through other devices or some connection means. Terms such as "first" and "second" used throughout this specification (including the claims) are used to name elements or to distinguish different embodiments or ranges, rather than to restrict the upper limit or lower limit of the number of elements, nor are they intended to restrict the order of the elements. Also, where possible, elements/components/steps using the same reference numerals in the drawings and embodiments represent the same or similar parts. Elements/components/steps that have the same reference numerals or names in different embodiments may serve as reference for each other.

FIG. 1 is a schematic circuit block diagram of an integrated circuit 100 according to an embodiment of the disclosure. The integrated circuit 100 shown in FIG. 1 includes an identifier generation circuit 110, a memory controller 120 and a one-time programmable (OTP) memory 130, wherein the memory controller 120 is coupled to the OTP memory 130. The memory controller 120 manages/controls operations of data access to the OTP memory 130.

The OTP memory features that no data can be written once the OTP memory has been powered on for the first time to be programmed or burned with data. If the OTP memory 130 has not been programmed or burned in any data, each bit of the data read from the OTP memory 130 is in an "unprogrammed state." Based on the attribute of the OTP memory 130, in some embodiments, the "unprogrammed state" means that "every bit is 1." In other embodiments, the "unprogrammed state" means that "every bit is 0." Ideally the OTP memory can be read unlimited times. That is to say, by reading the data of the OTP memory 130, the disclosure can confirm whether the OTP memory 130 has been programmed or burned.

In another embodiment, the disclosure further includes a non-volatile memory (NVM), which is an electrically-erasable programmable read-only memory (EEPROM) or a flash memory. When the NVM is programmed or burned in for the first time, the OTP memory 130 needs to be programmed or burned in at the same time, and subsequently no writing operation is performed on the NVM. In this way, by reading the data of the OTP memory 130, the disclosure can confirm whether the NVM and the OTP memory 130 have been programmed or burned in.

Figure 2:
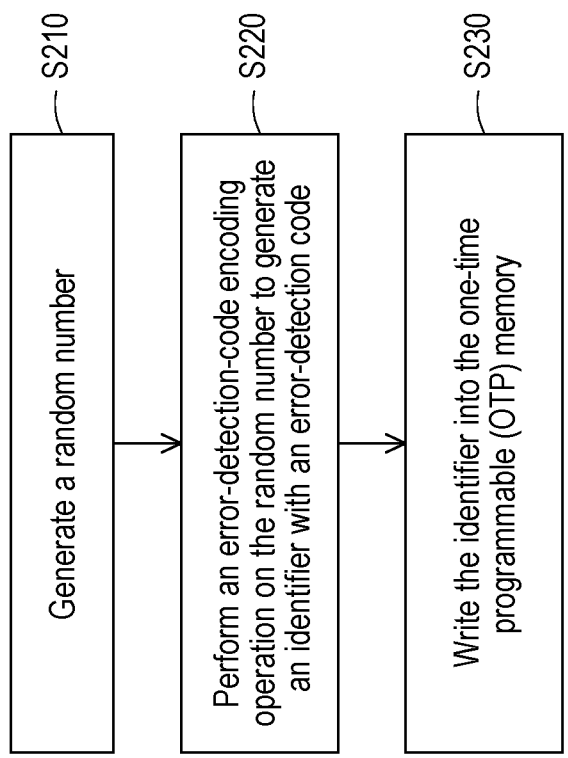
FIG. 2 is a schematic flowchart of an operation method of an integrated circuit according to an embodiment of the disclosure.

FIG. 2 is a schematic flowchart of an operation method of an integrated circuit according to an embodiment of the disclosure. Please refer to FIG. 1 and FIG. 2. In step S210, the identifier generation circuit 110 generates a random number. The embodiment does not limit how the random number is generated. Random numbers are uncontrollable, unpredictable and unreplicable. Due to process variations, the identifier generation circuit 110 is unique to the device, and therefore can generate an unpredictable random number.

In step S220, the identifier generation circuit 110 performs an error-detection-code encoding operation on the random number to generate an identifier with an error-detection code. The embodiment does not limit the encoding details of the error-detection-code encoding operation. According to the actual design, in some embodiments, the error-detection code includes an error-correcting code (ECC) or a Hamming code with additional parity. For example, the Hamming codes include [8,4] Hamming codes, [72,64] Hamming codes, or other Hamming codes with additional parity. The error-detection code has a function of single error correction and double error detection (SECDED).

The memory controller 120 is coupled to the identifier generation circuit 110 to receive the identifier with the error-detection code. In step S230, the memory controller 120 writes the identifier generated by the identifier generation circuit 110 into the OTP memory 130. The identifier has the attribute of randomness. From a statistical point of view, an ideal identifier has a hamming weight of 50%, meaning that there is a split of 50/50 0s and 1s in a set of identifiers, making identifiers the hardest to guess.

The identifier has the attribute of uniqueness. As it is almost impossible for two people in the world to have exactly the same fingerprint, the chances of collision of identifiers are the lowest (the probability of different integrated circuits producing exactly the same PUF is very low). The difference between the values of two strings of characters with exactly the same length is generally measured using the hamming distance. A 50% Hamming distance means that between any two strings of characters (two identifiers), half of the numbers are the same and the other half are different. In this case, the two strings have the lowest chance of being deciphered by brute force attacks and so constitute an ideal identifier.

The identifier has the attribute of robustness. The identifier retains its value and functions throughout the entire product life cycle. Robustness means that the 0s and 1s of the identifier in the OTP memory 130 will not reverse even under severe surrounding changes. In other words, an ideal PUF should have 0% bit-error-rate. That is, the identifier is always the same each time the identifier is read from the OTP memory 130.

The identifier has the attribute of non-traceability. As the root of trust, the identifier is resistant to physical attacks. Non-traceability is an important feature of an ideal PUF. The random value in the identifier should not be able to be inferred and extracted by any method, such as reverse engineering, charge residue measurement or otherwise.

Figure 3:
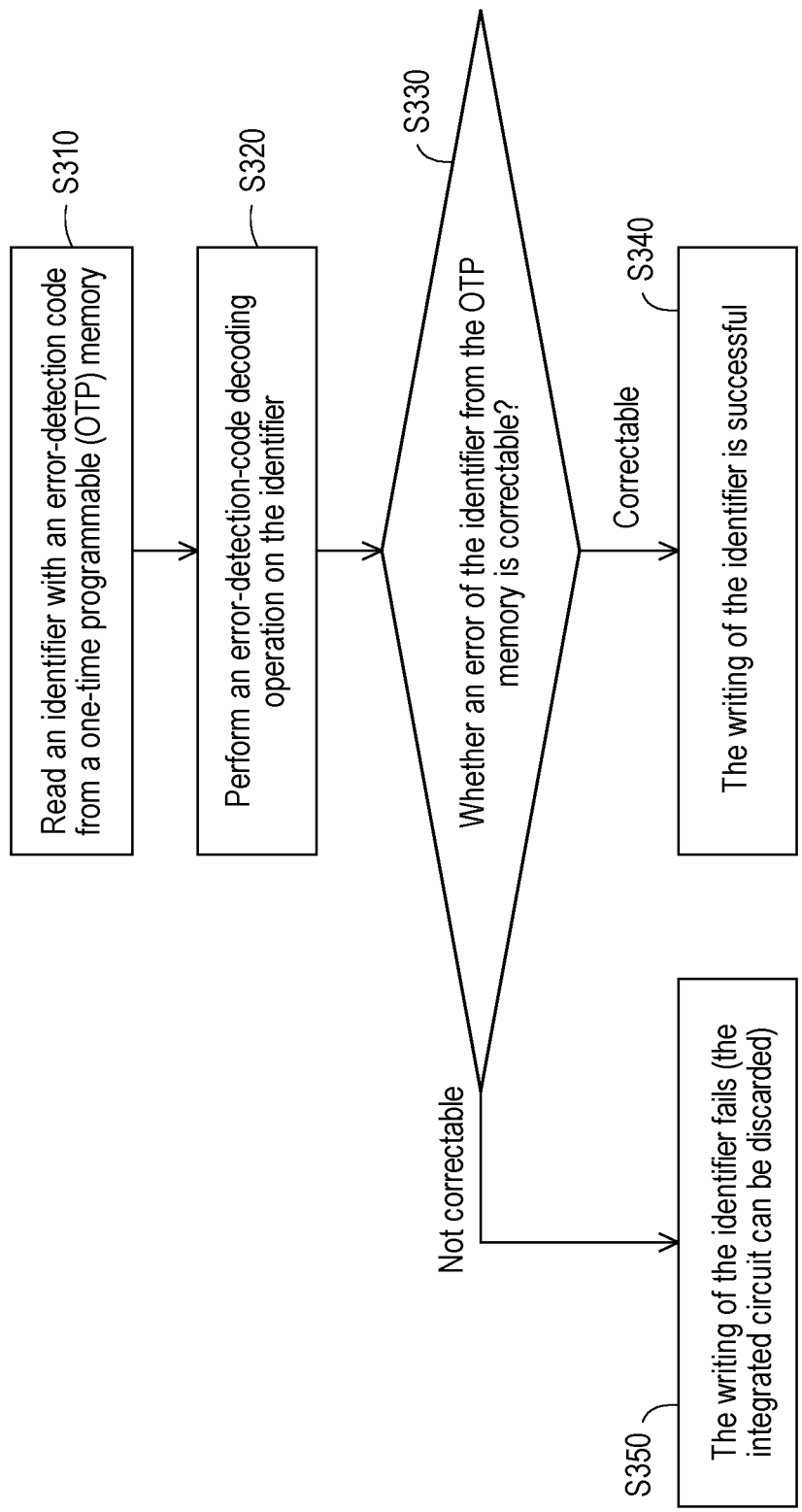
FIG. 3 is a schematic flowchart of an inspection method of an integrated circuit according to another embodiment of the disclosure.

FIG. 3 is a schematic flowchart of an inspection method of an integrated circuit according to another embodiment of the disclosure. Please refer to FIG. 1 and FIG. 3. In step S310, the memory controller 120 reads the identifier from the OTP memory 130 to provide to the identifier generation circuit 110. In step S320, the identifier generation circuit 110 performs an error-detection-code decoding operation on the identifier provided by the memory controller 120 to determine whether the error of the identifier from the OTP memory 130 is correctable. When it is determined that the error of the identifier from the OTP memory 130 is correctable in step S320 (the result determined in step S330 is "Yes"), the identifier generation circuit 110 determines that the writing of the identifier is successful (step S340). When it is determined that the error of the identifier from the OTP memory 130 is not correctable (the result determined in step S330 is "No"), the writing of the identifier is deemed failed (step S350), so the integrated circuit 100 can be discarded.

Figure 4:
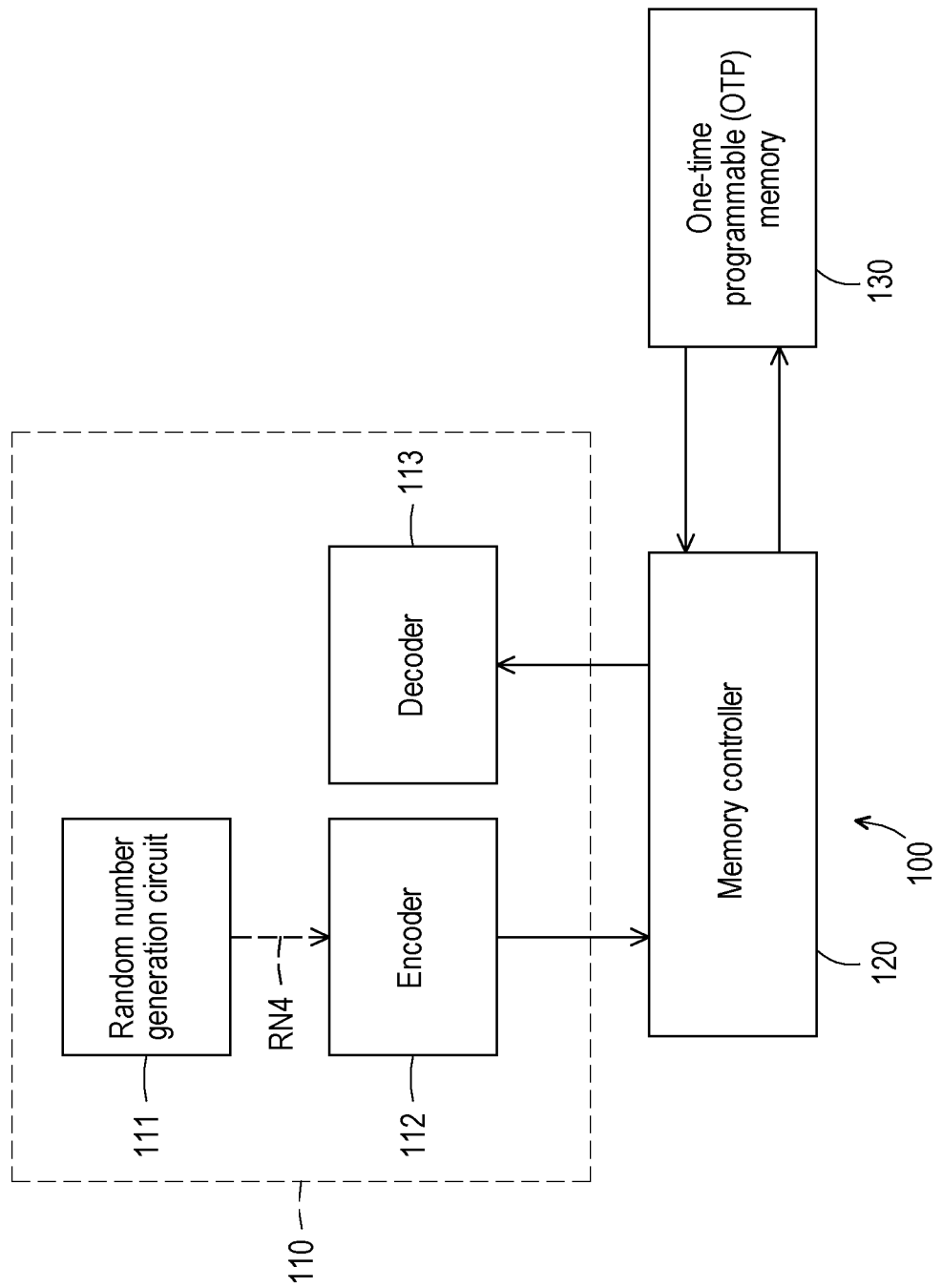
FIG. 4 is a schematic circuit block diagram of an identifier generation circuit according to an embodiment of disclosure.

FIG. 4 is a schematic circuit block diagram of an identifier generation circuit 110 according to an embodiment of disclosure. The identifier generation circuit 110 shown in FIG. 4 includes a random number generation circuit 111, an encoder 112 and a decoder 113. The random number generation circuit 111 generates a random number RN4 to the encoder 112. This embodiment does not limit the implementation details of the random number generation circuit 111. For example, in some embodiments, the random number generation circuit 111 includes a true random number generator (TRNG) to generate the random number RN4 to the encoder 112. The TRNG can generate the random number RN4 using unpredictable physical methods (such as atmospheric noise).

In other embodiments, the random number generation circuit 111 includes a pseudo-random number generator (PRNG) to generate the random number RN4 to the encoder 112. The PRNG can use mathematical algorithms to generate and provide the random number RN4 to the encoder 112. For example, the PRNG uses a seed value to calculate the random number RN4. According to the actual design, the seed value can either be a static or a dynamic real number. In another embodiment, the random number generation circuit 111 includes both a TRNG and a PRNG. The random number generation circuit randomly selects one of the random numbers generated by the TRNG and the PRNG to send to the encoder 112 as the random number RN4.

Figure 5:
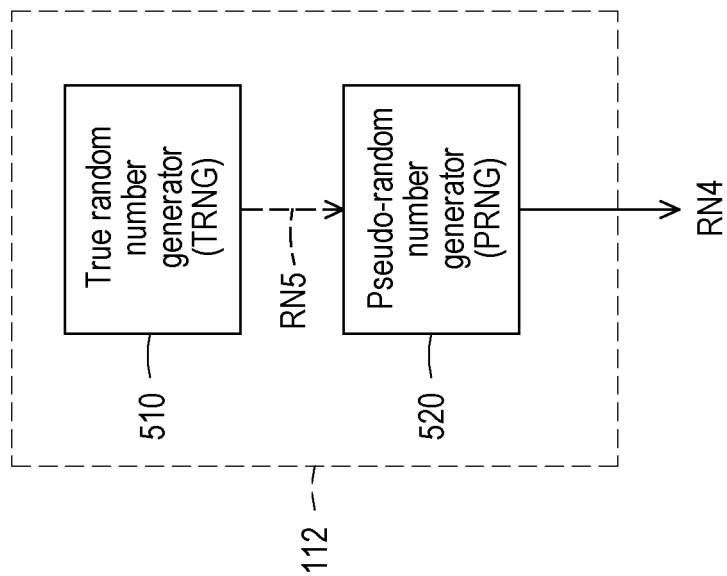
FIG. 5 is a schematic circuit block diagram of a random number generation circuit according to an embodiment of the disclosure.

FIG. 5 is a schematic circuit block diagram of a random number generation circuit 111 according to an embodiment of the disclosure. The random number generation circuit 111 shown in FIG. 5 includes a TRNG 510 and a PRNG 520. The TRNG 510 generates an unpredictable seed value RN5. The PRNG 520 is coupled to the TRNG 510 to receive the unpredictable seed value RN5. The PRNG 520 performs mathematical algorithms using the unpredictable seed value RN5 to generate the random number RN4 for the encoder 112.

Figure 6:
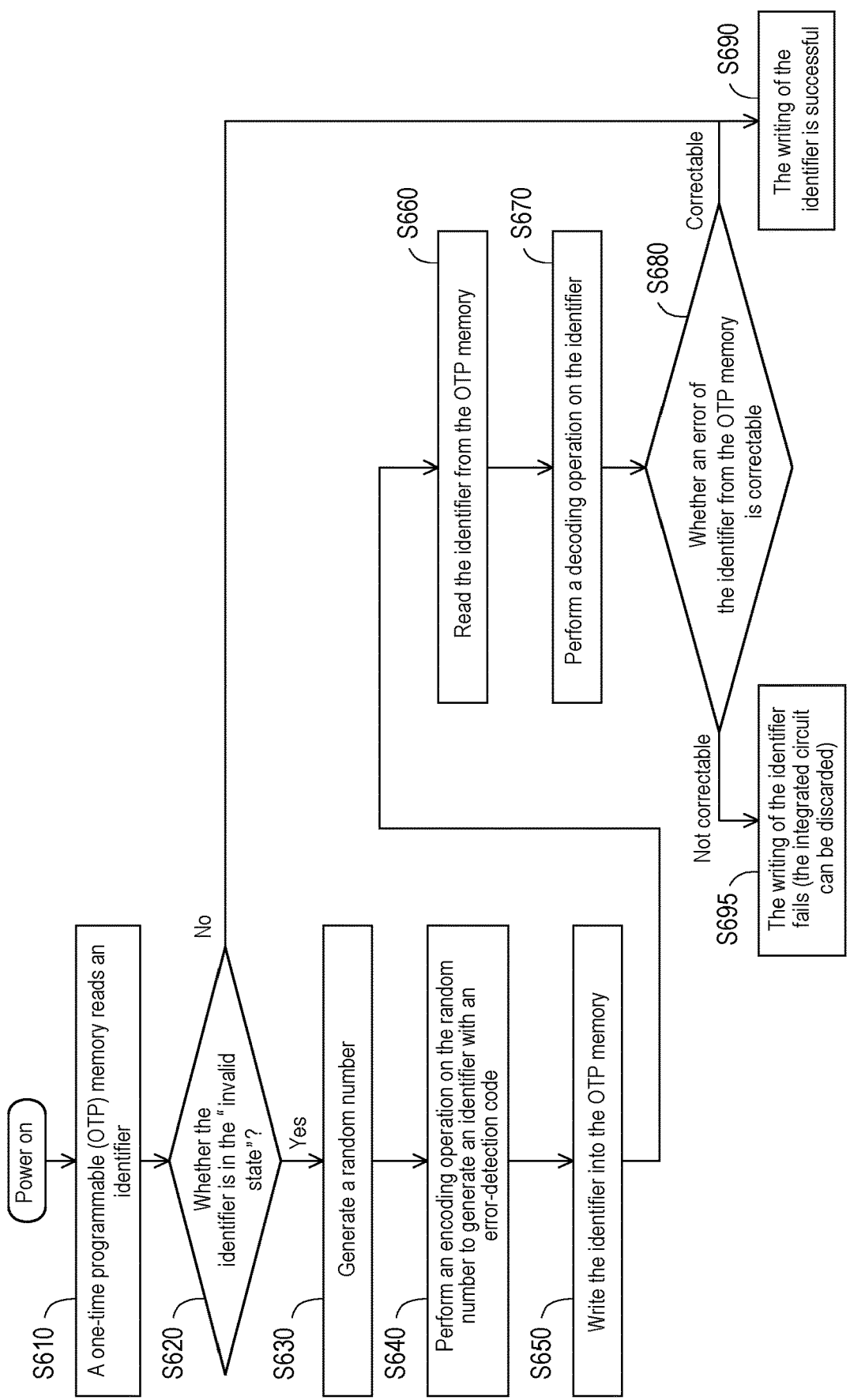
FIG. 6 is a schematic flowchart of an operation method of an integrated circuit according to yet another embodiment of the disclosure.

FIG. 6 is a schematic flowchart of an operation method of an integrated circuit according to yet another embodiment of the disclosure. Please refer to FIG. 4 and FIG. 6. After the integrated circuit 100 is powered on, an identifier generation circuit 110 tries to read an identifier from an OTP memory 130 through a memory controller 120 (step S610). Generally speaking, if the OTP memory 130 has not been programmed or burned in with any data, each bit of data read from the OTP memory 130 is in an "unprogrammed state." Based on the attribute of the OTP memory 130, in some embodiments, the "unprogrammed state" means that "every bit is 1." In other embodiments, the "unprogrammed state" means that "every bit is 0." The identifier generation circuit 110 inspects whether the identifier from the OTP memory 130 is in the "unprogrammed state" (that is, invalid state) in step S620. When the identifier from the OTP memory 130 is not in the invalid state (the result determined in step S620 is "No"), it means that the identifier has been successfully written into the OTP memory 130 (step S690). That is, the integrated circuit 100 can provide the identifier (circuit "fingerprint") for authentication or other trusted applications, which has attributes equivalent to a physically unclonable function (PUF).

When the identifier from the OTP memory 130 is in the invalid state (the result determined in step S620 is "Yes"), it means that the identifier has not been written into the OTP memory 130, so the integrated circuit 100 proceeds to step S630. In step S630, the identifier generation circuit 110 generates a random number. An encoder 112 is coupled to the random number generation circuit 111 to receive a random number RN4. In step S640, the encoder 112 performs an encoding operation on the random number RN4 to generate an error-detection code, and outputs the error-detection code and the random number RN4 as an identifier to the memory controller 120. In step S650, the memory controller 120 writes the identifier generated by the encoder 112 into the OTP memory 130. Steps S630, S640 and S650 shown in FIG. 6 can be inferred from the related descriptions of steps S210, S220 and S230 shown in FIG. 2, so further explanations are omitted here.

Please refer to FIG. 4 and FIG. 6. The decoder 113 is coupled to the memory controller 120 to receive the identifier. After the memory controller 120 writes the identifier generated by the identifier generation circuit 110 into the OTP memory 130 (step S650), the identifier generation circuit 110 performs steps S660, S670 and S680 to verify whether the identifier is successfully written into the OTP memory 130. In step S660, the memory controller 120 reads the identifier from the OTP memory 130 to provide to the decoder 113. In step S670, the decoder 113 performs an error-detection-code decoding operation on the identifier provided by the memory controller 120 to determine whether the error of the identifier from the OTP memory 130 is correctable. For example, the decoder 113 decodes the identifier using the error-detection code in the identifier to determine whether the error of the identifier from the OTP memory 130 is correctable. Steps S660, S670, S680, S690 and S695 shown in FIG. 6 can be inferred from the related descriptions of steps S310, S320, S330, S340 and S350 shown in FIG. 3, so further explanations are omitted here.

Figure 7:
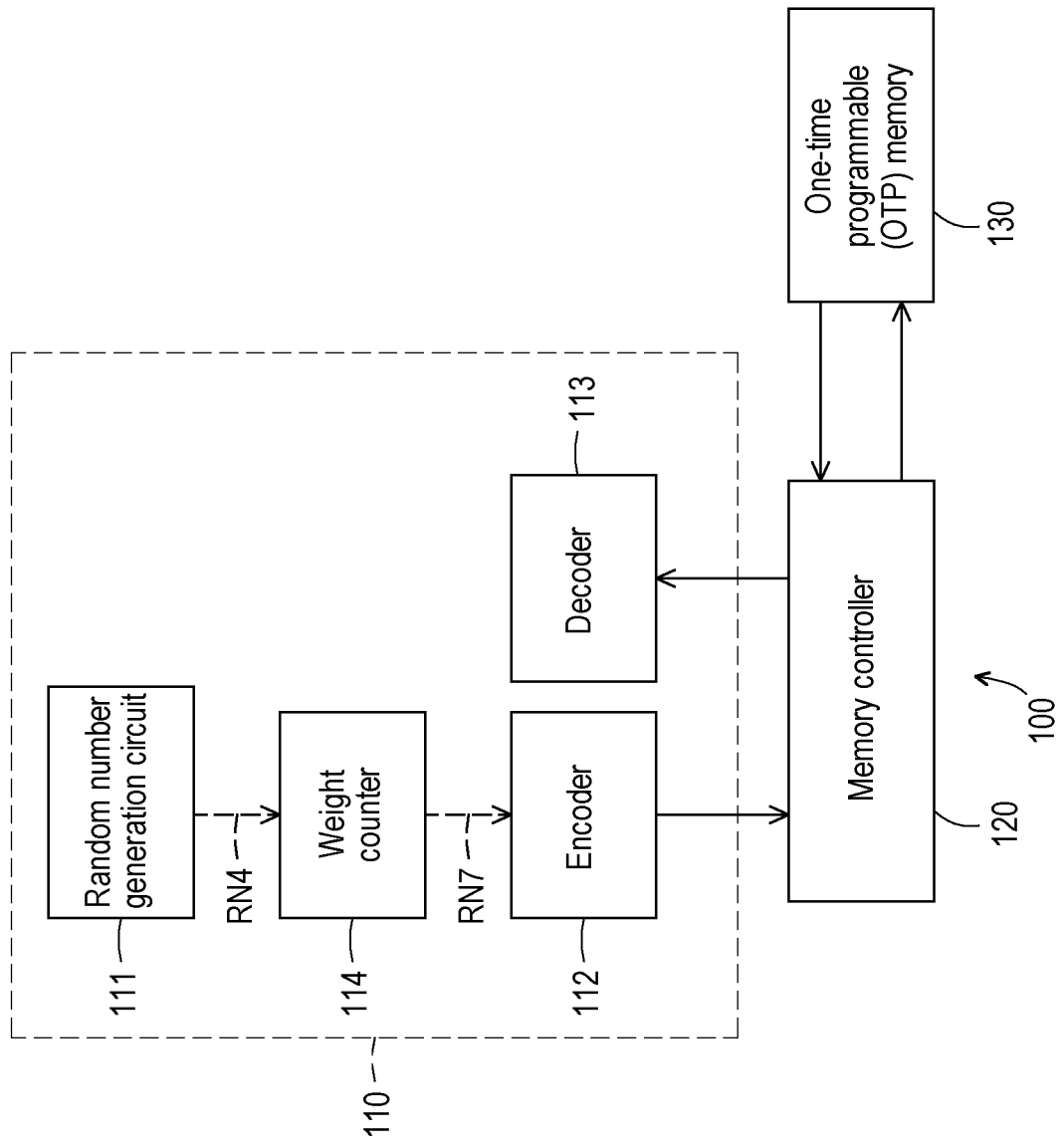
FIG. 7 is a schematic circuit block diagram of an identifier generation circuit according to another embodiment of the disclosure.

FIG. 7 is a schematic circuit block diagram of an identifier generation circuit 110 according to another embodiment of the disclosure. The identifier generation circuit 110 shown in FIG. 7 includes a random number generation circuit 111, an encoder 112, a decoder 113 and a weight counter 114. The random number generation circuit 111, the encoder 112 and the decoder 113 shown in FIG. 7 can be inferred from the related descriptions of the random number generation circuit 111, the encoder 112 and the decoder 113 shown in FIG. 4, so further explanations are omitted here.

In the embodiment shown in FIG. 7, the weight counter 114 is coupled to the random number generation circuit 111 to receive a random number RN4. The weight counter 114 calculates the weight (e.g. Hamming weight) of the random number RN4, and inspects whether the weight of the random number RN4 falls within a certain proportional range. The proportional range is determined according to the actual design. For example, in some embodiments, the proportional range is from 49% to 51%. In other embodiments, the proportional range is from 45% to 55%. In still other embodiments, the proportional range is from 40% to 60%. However, the weight counter 114 is not limited to calculating the Hamming weight. For example, the length of a string of characters being converted from 0 to 1 or characters being converted from 1 to 0 can also be used as one of the measurement variables to ensure sufficient conversion times.

Figure 8:
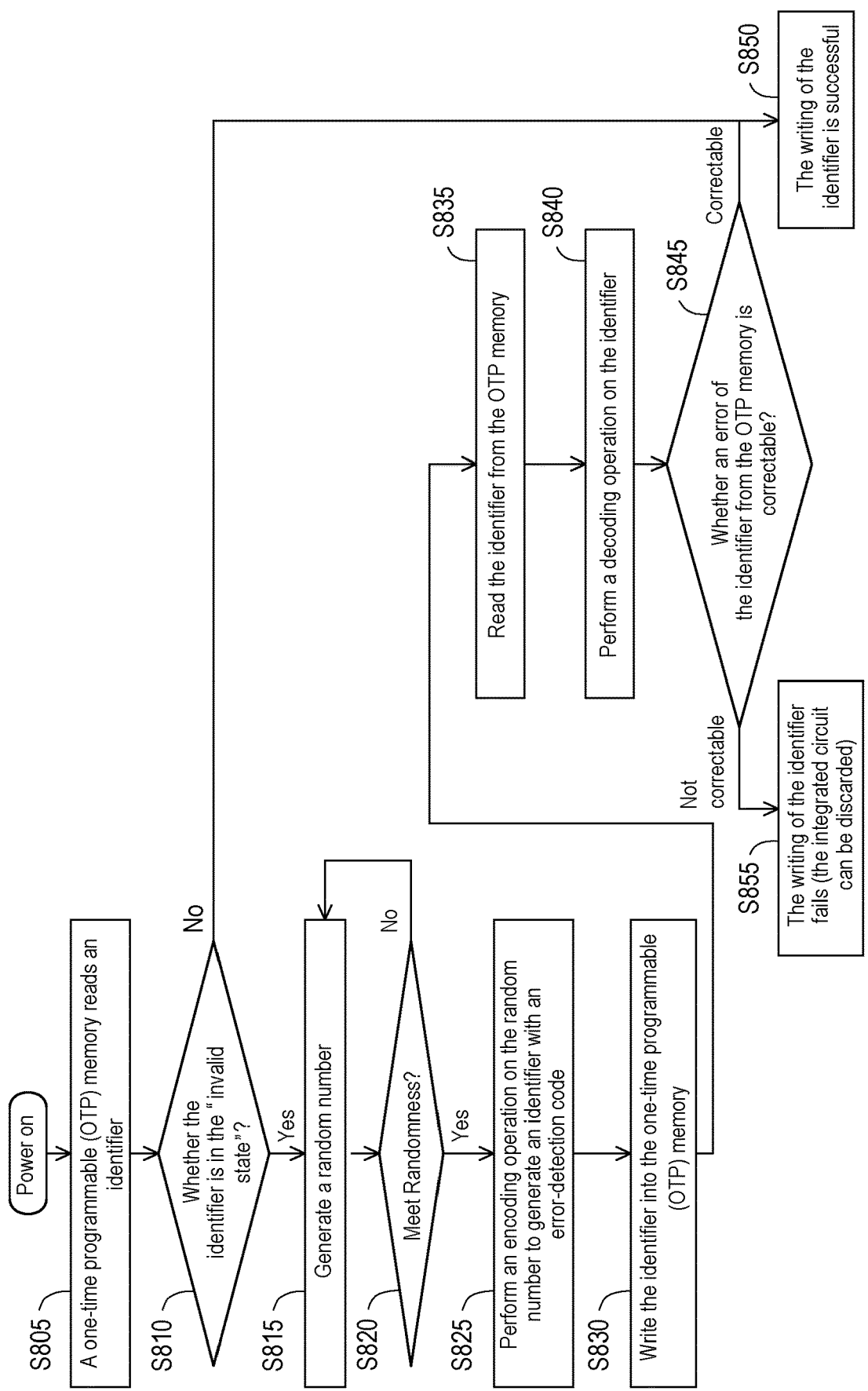
FIG. 8 is a schematic flowchart of an operation method of an integrated circuit according to still another embodiment of the disclosure.

FIG. 8 is a schematic flowchart of an operation method of an integrated circuit according to still another embodiment of the disclosure. Steps S805, S810 and S815 shown in FIG. 8 can be inferred from the related descriptions of steps S610, S620 and S630 shown in FIG. 6, so further explanations are omitted here. Please refer to FIG. 7 and FIG. 8. In step S820, a weight counter 114 inspects whether the randomness of a random number RN4 provided by a random number generation circuit 111 meets the rated requirement. For example, the weight counter 114 inspects whether the Hamming weight of the random number RN4 falls within a certain proportional range (e.g. 45%-55%). When the Hamming weight falls within the proportional range (the result determined in step S820 is "Yes"), the weight counter 114 outputs the random number RN4 as a random number RN7 to the encoder 112, and then the identifier generation circuit 110 proceeds to step S825. When the Hamming weight falls outside the proportional range (the result determined in step S820 is "No"), the weight counter 114 notifies the random number generation circuit 111 to regenerate a new random number RN4 (returning to step S815), until the Hamming weight of the random number RN4 falls within the proportional range. The weight counter 114 then outputs the random number RN4 as the random number RN7 to the encoder 112 (proceeding then to step S825). However, the weight counter 114 is not limited to calculating the Hamming weight, as described above.

The encoder 112 is coupled to the weight counter 114 to receive the random number RN7. In step S825, the encoder 112 performs an encoding operation on the random number RN7 to generate an error-detection code, and outputs the error-detection code and the random number RN7 as the identifier to the memory controller 120. Steps S825, S830, S835, S840, S845, S850 and S855 shown in FIG. 8 can be inferred from the related descriptions of steps S640, S650, S660, S670, S680, S690 and S695 shown in FIG. 6, so further explanations are omitted here.

Figure 9:
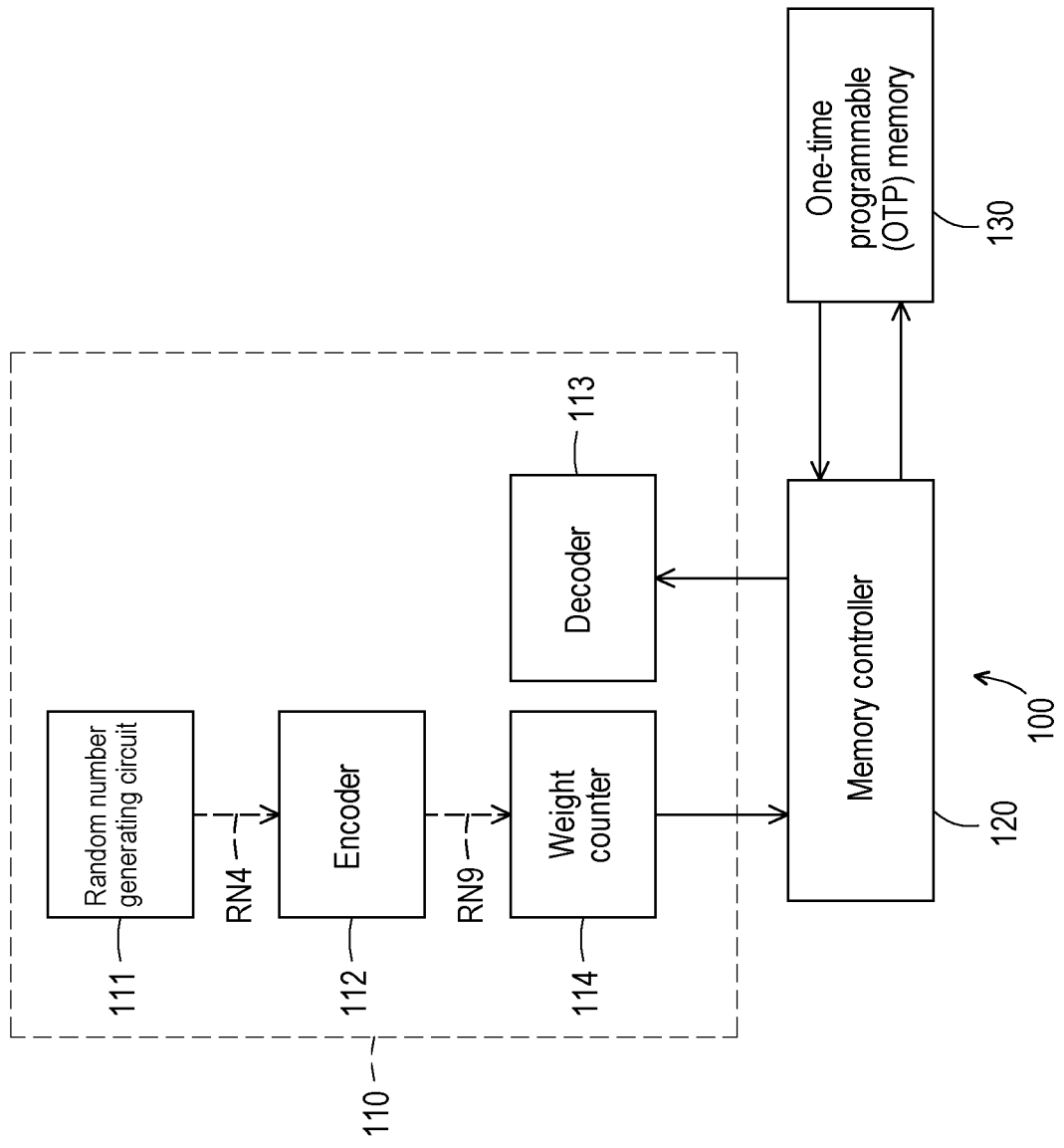
FIG. 9 is a schematic circuit block diagram of an identifier generation circuit according to yet another embodiment of the disclosure.

FIG. 9 is a schematic circuit block diagram of an identifier generation circuit according to yet another embodiment of the disclosure. The identifier generation circuit 110 shown in FIG. 9 includes a random number generation circuit 111, an encoder 112, a decoder 113 and a weight counter 114. The random number generation circuit 111, the encoder 112 and the decoder 113 shown in FIG. 9 can be inferred from the related descriptions of the random number generation circuit 111, the encoder 112 and the decoder 113 shown in FIG. 4. The weight counter 114 shown in FIG. 9 can be inferred from the weight counter 114 shown in FIG. 7, so further explanations are omitted here.

In the embodiment shown in FIG. 9, the encoder 112 is coupled to the random number generation circuit 111 to receive a random number RN4, on which the encoder 112 performs an encoding operation to generate an error-detection code, and outputs the error-detection code and the random number RN4 to the weight counter 114 as an identifier RN9. The weight counter 114 is coupled to the encoder 112. The weight counter 114 calculates the Hamming weight of the identifier RN9, and inspects whether the Hamming weight of the identifier RN9 falls within a certain proportional range (e.g. 45%-55%). However, the weight counter 114 is not limited to calculating the Hamming weight, as described above.

Figure 10:
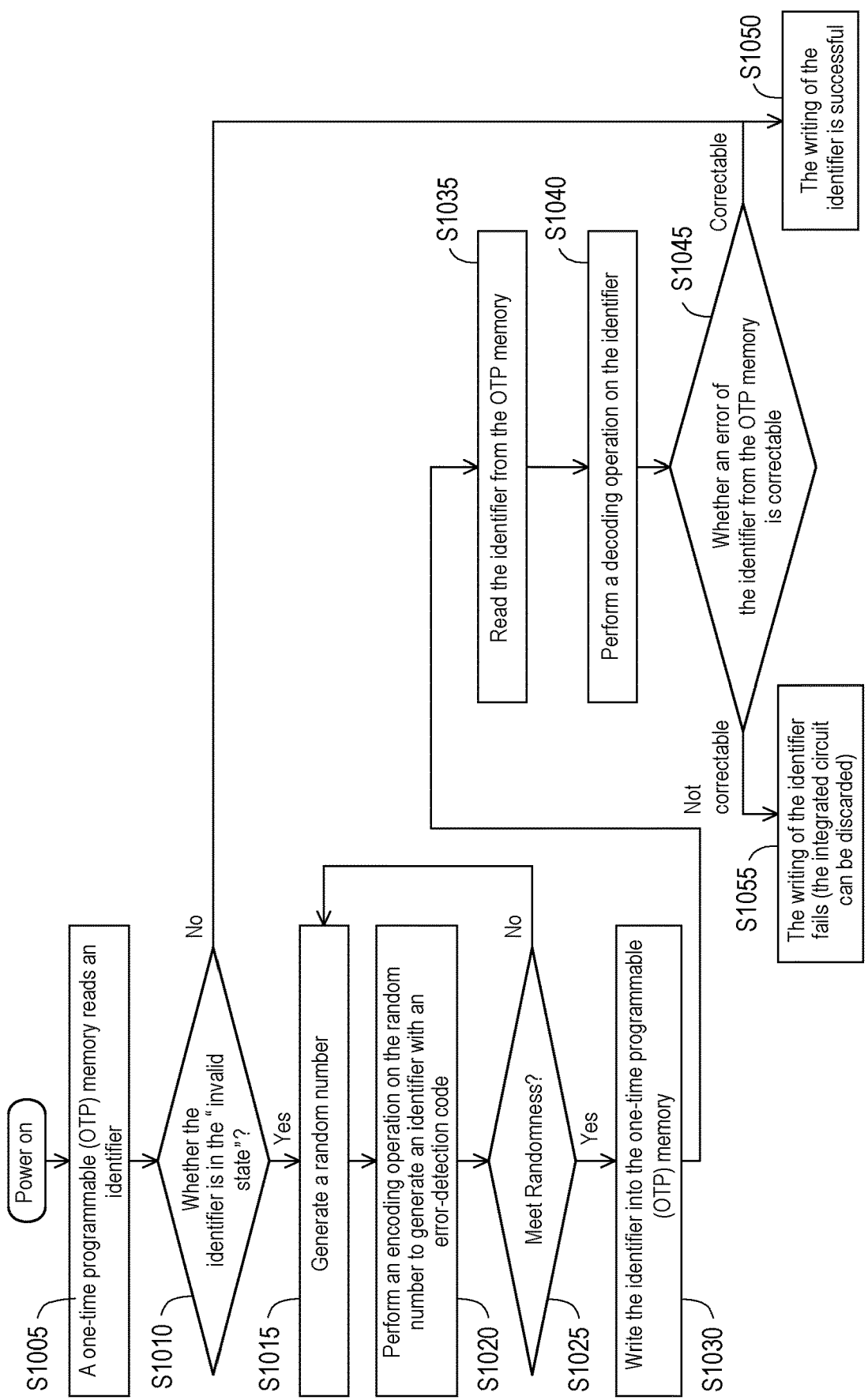
FIG. 10 is a schematic flowchart of an operation method of an integrated circuit according to a further embodiment of the disclosure.

FIG. 10 is a schematic flowchart of an operation method of an integrated circuit according to a further embodiment of the disclosure. Steps S1005, S1010, S1015 and S1020 shown in FIG. 10 can be inferred from the related descriptions of steps S610, S620, S630 and S640 shown in FIG. 6, so further explanations are omitted here. Please refer to FIG. 9 and FIG. 10. In step S1025, a weight counter 114 inspects whether the randomness of an identifier RN9 provided by an encoder 112 meets the rated requirement. For example, the weight counter 114 inspects whether the Hamming weight of the identifier RN9 falls within a certain proportional range (e.g. 45%-55%). When the Hamming weight falls within the proportional range (the result determined in step S1025 is "Yes"), the weight counter 114 outputs the identifier RN9 to a memory controller 120, and then the identifier generation circuit 110 proceeds to step S1030. When the Hamming weight falls outside the proportional range (the result determined in step S1025 is "No"), the weight counter 114 notifies the random number generation circuit 111 to regenerate a new random number RN4 (returning to step S1015), and the encoder 112 to regenerate the error-detection code and the identifier RN9 (step S1020), until the Hamming weight of the identifier RN9 falls within the proportional range. The weight counter 114 then outputs the identifier RN9 to the memory controller 120 (proceeding then to step S1030). However, the weight counter 114 is not limited to calculating the Hamming weight, as described above.

The memory controller 120 is coupled to the weight counter 114 to receive the identifier RN9. In step S1030, the memory controller 120 writes the identifier provided by the weight counter 114 into an OTP memory 130. Steps S1030, S1035, S1040, S1045, S1050 and S1055 shown in FIG. 10 can be inferred from the related descriptions of steps S650, S660, S670, S680, S690 and S695 shown in FIG. 6, so further explanations are omitted here.

Figure 11:
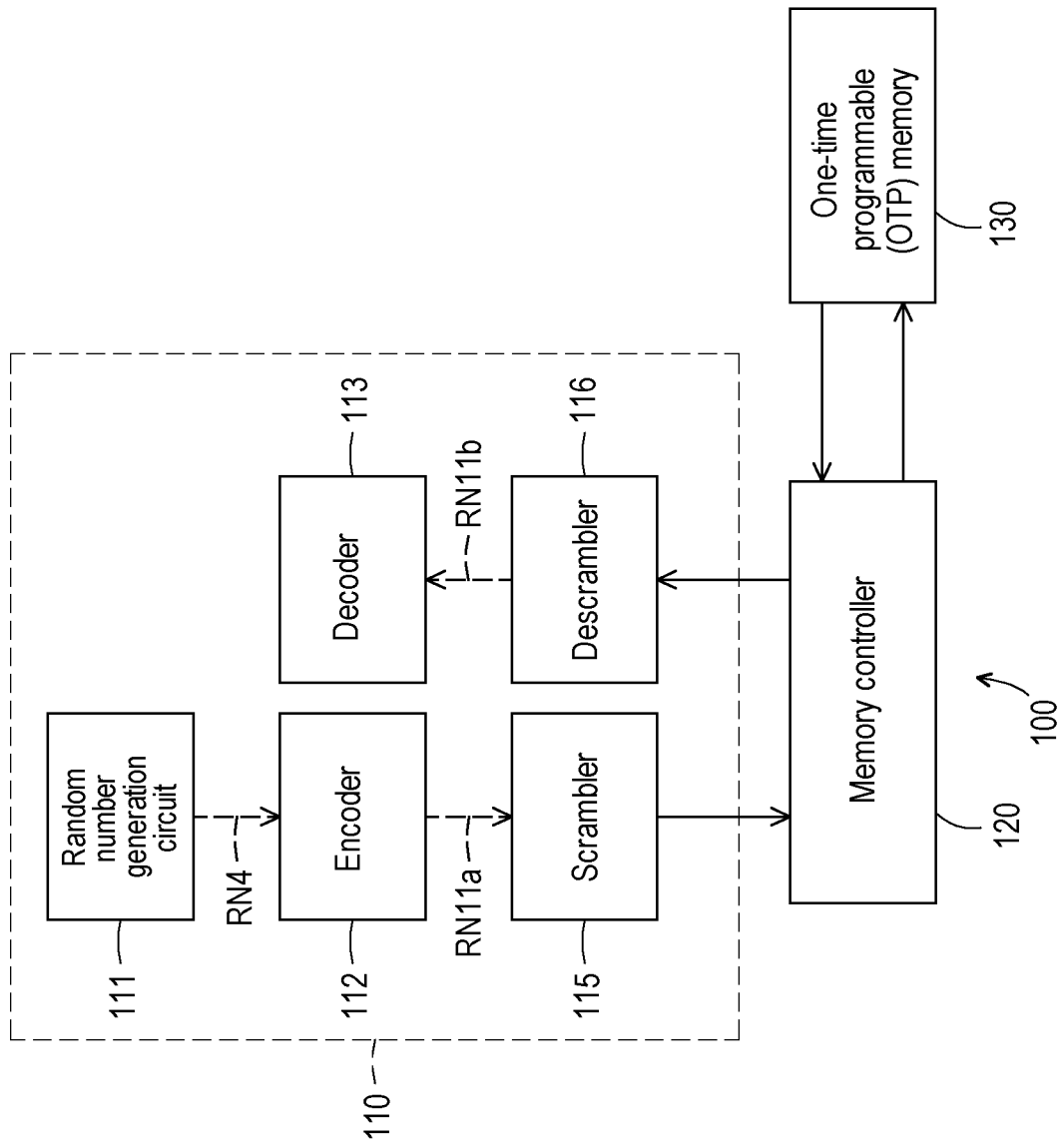
FIG. 11 is a schematic circuit block diagram of an identifier generation circuit according to still another embodiment of the disclosure.

FIG. 11 is a schematic circuit block diagram of an identifier generation circuit according to still another embodiment of the disclosure. The identifier generation circuit 110 shown in FIG. 13 includes a random number generation circuit 111, an encoder 112, a decoder 113, a scrambler 115 and a descrambler 116. The random number generation circuit 111, the encoder 112, and the decoder 113 shown in FIG. 11 can be inferred from the related descriptions of the random number generation circuit 111, the encoder 112, the decoder 113 shown in FIG. 4, so further explanations are omitted here.

In the embodiment shown in FIG. 11, the encoder 112 performs an encoding operation on a random number RN4 to generate an error-detection code, and outputs the error-detection code and the random number RN4 to the scrambler 115 as an original identifier RN11$a$. The scrambler 115 is coupled to the encoder 112. The scrambler 115 performs a scrambling operation on the original identifier RN11$a$ to generate an identifier to a memory controller 120. The descrambler 116 is coupled to the memory controller 120 to receive the identifier from the OTP memory 130. The descrambler 116 performs a descrambling operation on the identifier provided by the memory controller 120 to generate a descrambled identifier RN11*b* to the decoder 113. The decoder 113 is coupled to the descrambler 116 to receive the descrambled identifier RN11*b*. The decoder 113 performs a decoding operation on the descrambled identifier RN11*b* using the error-detection code in the descrambled identifier RN11*b* to determine whether the error of the identifier from the OTP memory 130 is correctable.

Figure 12:
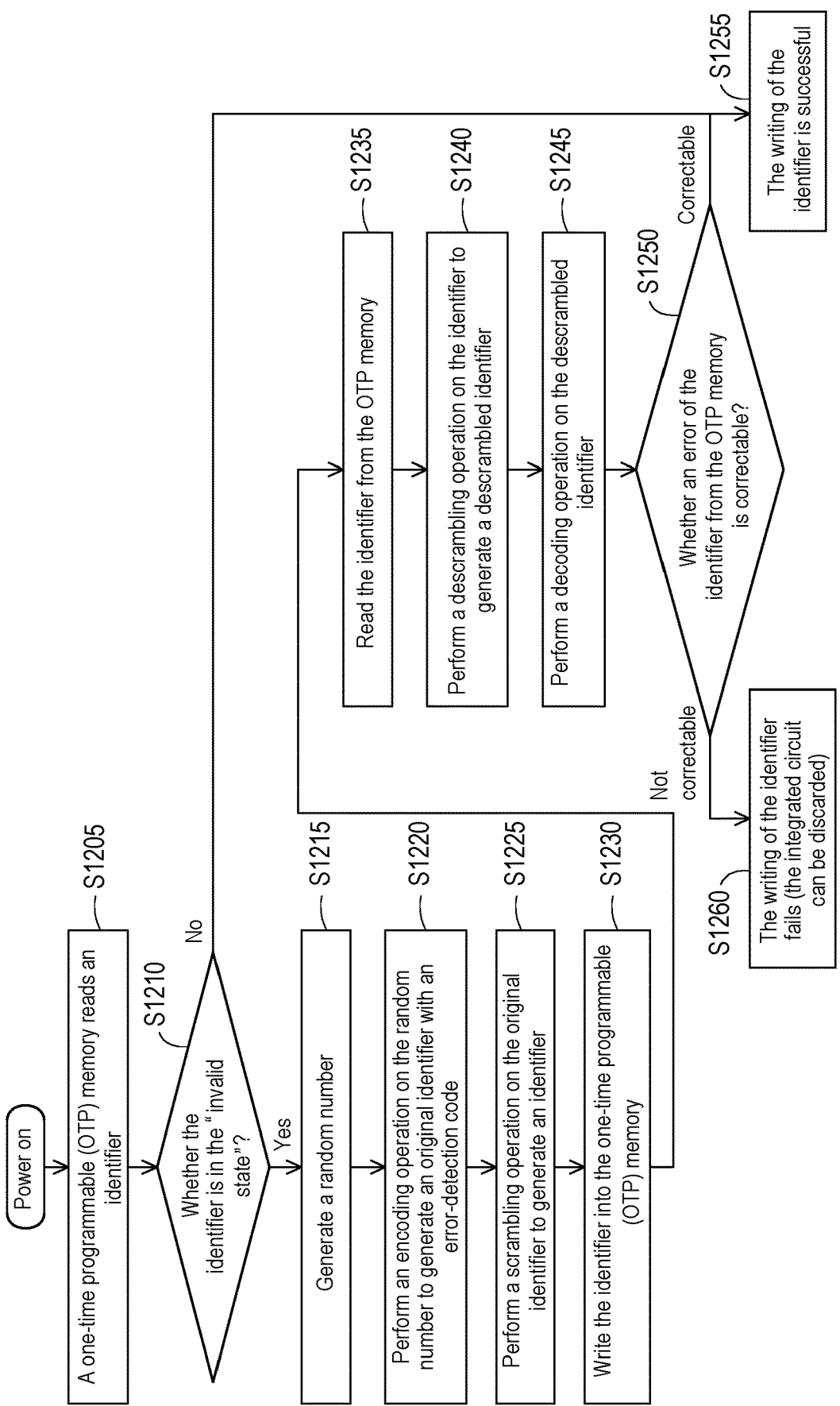
FIG. 12 is a schematic flowchart of an operation method of an integrated circuit according to another embodiment of the disclosure.

FIG. 12 is a schematic flowchart of an operation method of an integrated circuit according to another embodiment of the disclosure. Steps S1205, S1210, S1215 and S1220 shown in FIG. 12 can be inferred from the related descriptions of steps S610, S620, S630 and S640 shown in FIG. 6, so further explanations are omitted here. Please refer to FIG. 11 and FIG. 12. In step S1220, the encoder 112 performs an encoding operation on the random number RN4 to generate the error-detection code, and outputs the error-detection code and the random number RN4 to the scrambler 115 as the original identifier RN11*a*. In step S1225, the scrambler 115 performs a scrambling operation on the original identifier RN11*a* to generate an identifier to the memory controller 120.

Steps S1230 and S1235 shown in FIG. 12 can be inferred from the related descriptions of steps S650 and S660 shown in FIG. 6, so further explanations are omitted here. In step S1240 shown in FIG. 12, a descrambler 116 performs a descrambling operation on an identifier provided by a memory controller 120 to generate a descrambled identifier RN11*b* to a decoder 113. In step S1245, the decoder 113 performs a decoding operation on the descrambled identifier RN11*b* using the error-detection code in the descrambled identifier RN11*b* to determine whether the error of the identifier from the OTP memory 130 is correctable. Steps S1245, S1250, S1255 and S1260 shown in FIG. 12 can be inferred from the related descriptions of steps S670, S680, S690 and S695 shown in FIG. 6, so further explanations are omitted here.

Figure 13:
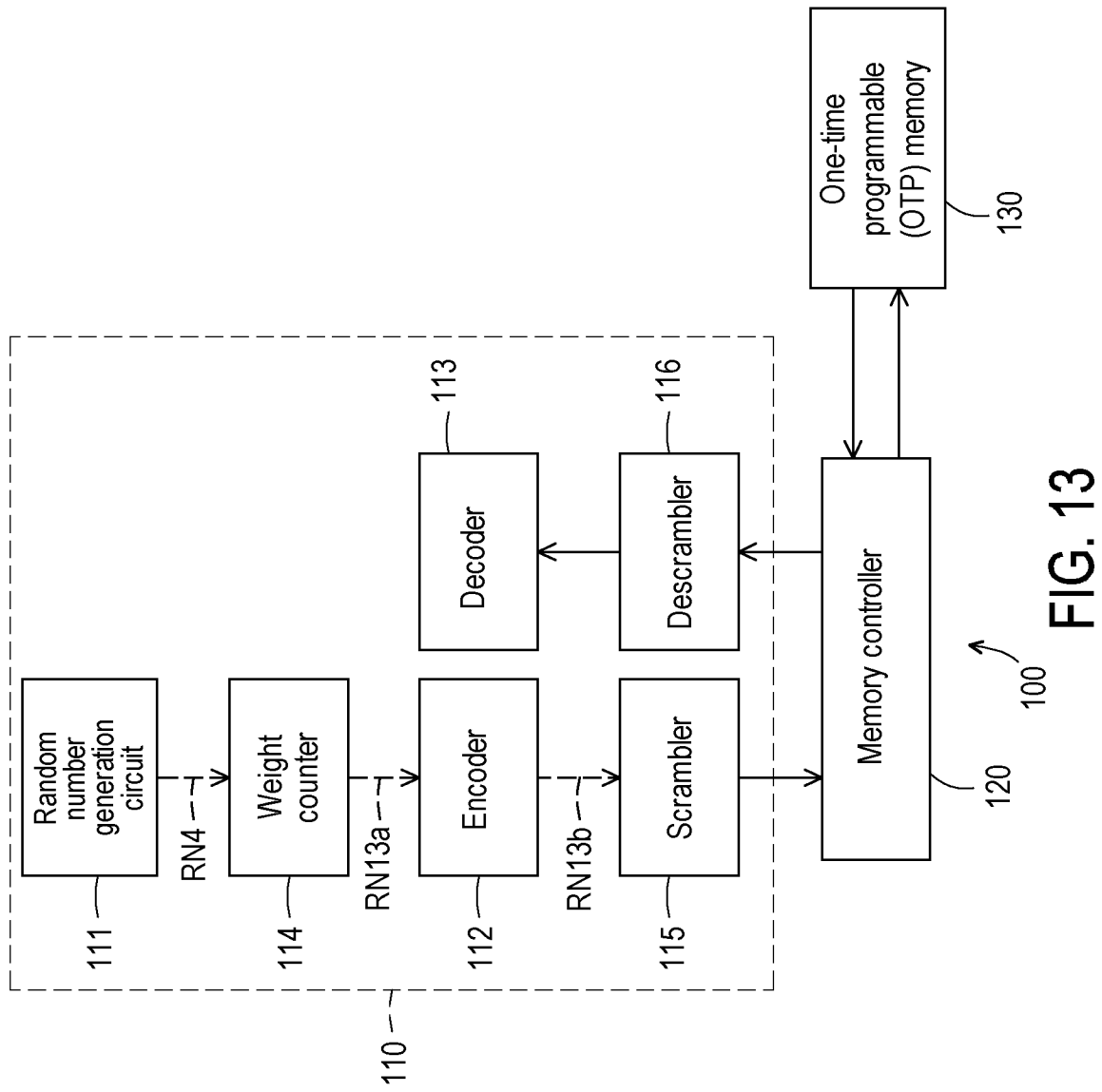
FIG. 13 is a schematic circuit block diagram of an identifier generation circuit according to a further embodiment of the disclosure.

FIG. 13 is a schematic circuit block diagram of an identifier generation circuit according to a further embodiment of the disclosure. The identifier generation circuit 110 shown in FIG. 13 includes a random number generation circuit 111, an encoder 112, a decoder 113, a weight counter 114, a scrambler 115 and a descrambler 116. The random number generation circuit 111, the encoder 112 and the decoder 113 shown in FIG. 13 can be inferred from the related descriptions of the random number generation circuit 111, the encoder 112 and the decoder 113 shown in FIG. 4; the weight counter 114 shown in FIG. 13 can be inferred from the related descriptions of the weight counter 114 shown in FIG. 7; and the scrambler 115 and the descrambler 116 shown in FIG. 13 can be inferred from the related descriptions of the scrambler 115 and the descrambler 116 shown in FIG. 11, so further explanations are omitted here. In the embodiment shown in FIG. 13, the weight counter 114 is coupled to the random number generation circuit 111. The weight counter 114 calculates the Hamming weight of a random number RN4, and inspects whether the Hamming weight of the random number RN4 falls within a certain proportional range (e.g. 45%-55%). However, the weight counter 114 is not limited to calculating the Hamming weight, as described above.

Figure 14:
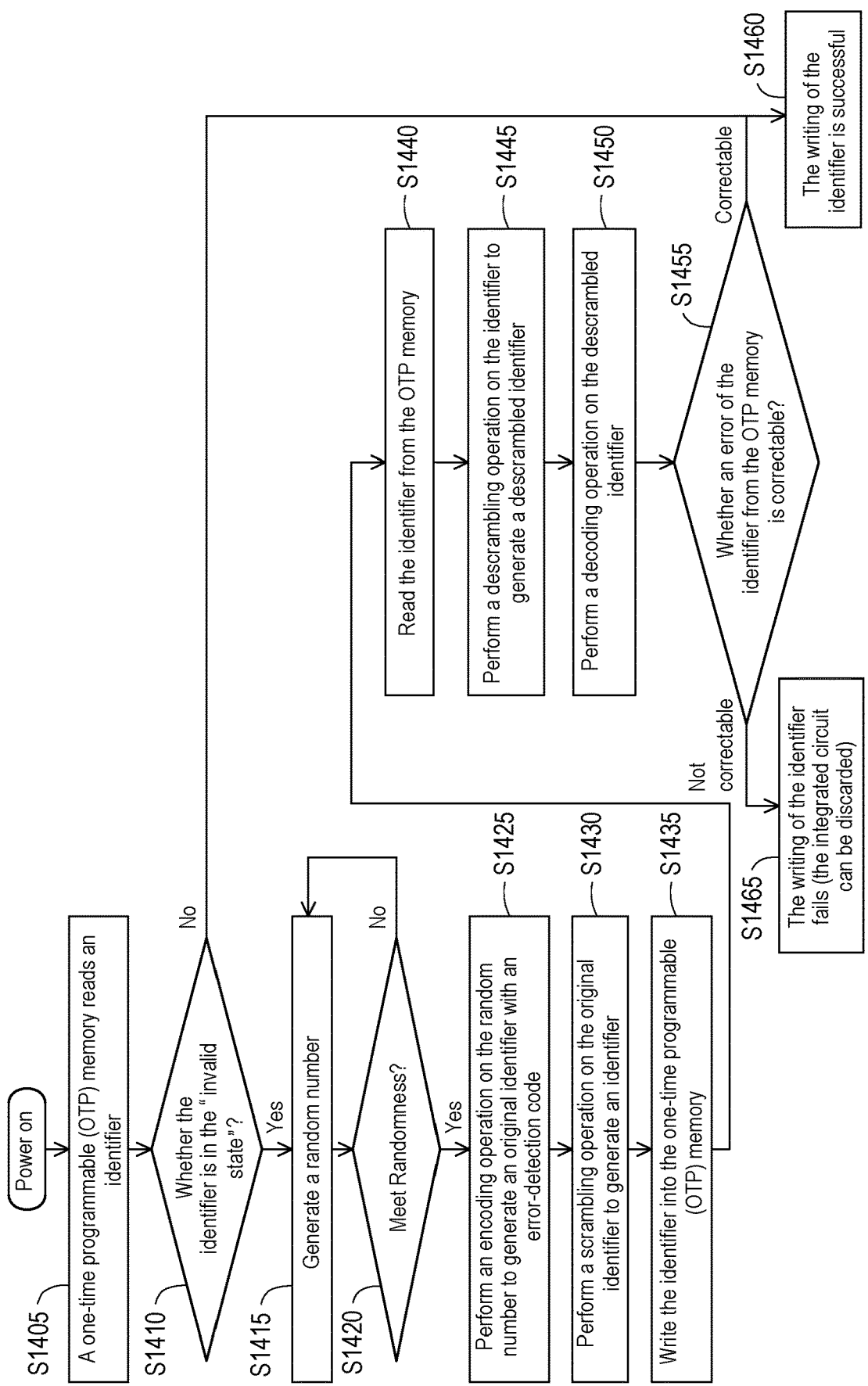
FIG. 14 is a schematic flowchart of an operation method of an integrated circuit according to still another embodiment of the disclosure.

FIG. 14 is a schematic flowchart of an operation method of an integrated circuit according to still another embodiment of the disclosure. Steps S1405, S1410 and S1415 shown in FIG. 14 can be inferred from the related descriptions of steps S610, S620 and S630 shown in FIG. 6, so further explanations are omitted here. Please refer to FIG. 13 and FIG. 14. In step S1420, the weight counter 114 inspects whether the randomness of the random number RN4 provided by the random number generation circuit 111 meets the rated requirement. For example, the weight counter 114 inspects whether the Hamming weight of the random number RN4 falls within a certain proportional range (e.g. 45%-55%). When the Hamming weight falls within the proportional range (the result determined in step S1420 is "Yes"), the weight counter 114 outputs the random number RN4 as a random number RN13*a* to the encoder 112, and then the identifier generation circuit 110 proceeds to step S1425. When the Hamming weight falls outside the proportional range (the result determined in step S1420 is "No"), the weight counter 114 notifies the random number generation circuit 111 to regenerate a new random number RN4 (returning to step S1415), and until the Hamming weight of the random number RN4 falls within the proportional range, the weight counter 114 outputs the random number RN4 as a random number RN13*a* to the encoder 112 (proceeding then to step S1425). However, the weight counter 114 is not limited to calculating the Hamming weight, as described above. Step S1420 shown in FIG. 14 can be inferred from the related descriptions of step S820 shown in FIG. 8, so further explanations are omitted here.

The encoder 112 is coupled to the weight counter 114 to receive the random number RN13*a*. In step S1425, the encoder 112 performs an encoding operation on the random number RN13*a* to generate an error-detection code, and outputs the error-detection code and the random number RN13*a* to the scrambler 115 as an original identifier RN13*b*. The scrambler 115 is coupled to the encoder 112. In step S1425, the scrambler 115 performs a scrambling operation on the original identifier RN13*b* to generate an identifier to the memory controller 120. Steps S1425, S1430, S1435, S1440, S1445, S1450, S1455, S1460 and S1465 shown in FIG. 14 can be inferred from the related descriptions of steps S1220, S1225, S1230, S1235, S1240, S1245, S1250, S1255 and S1260 shown in FIG. 12, so further explanations are omitted here.

Figure 15:
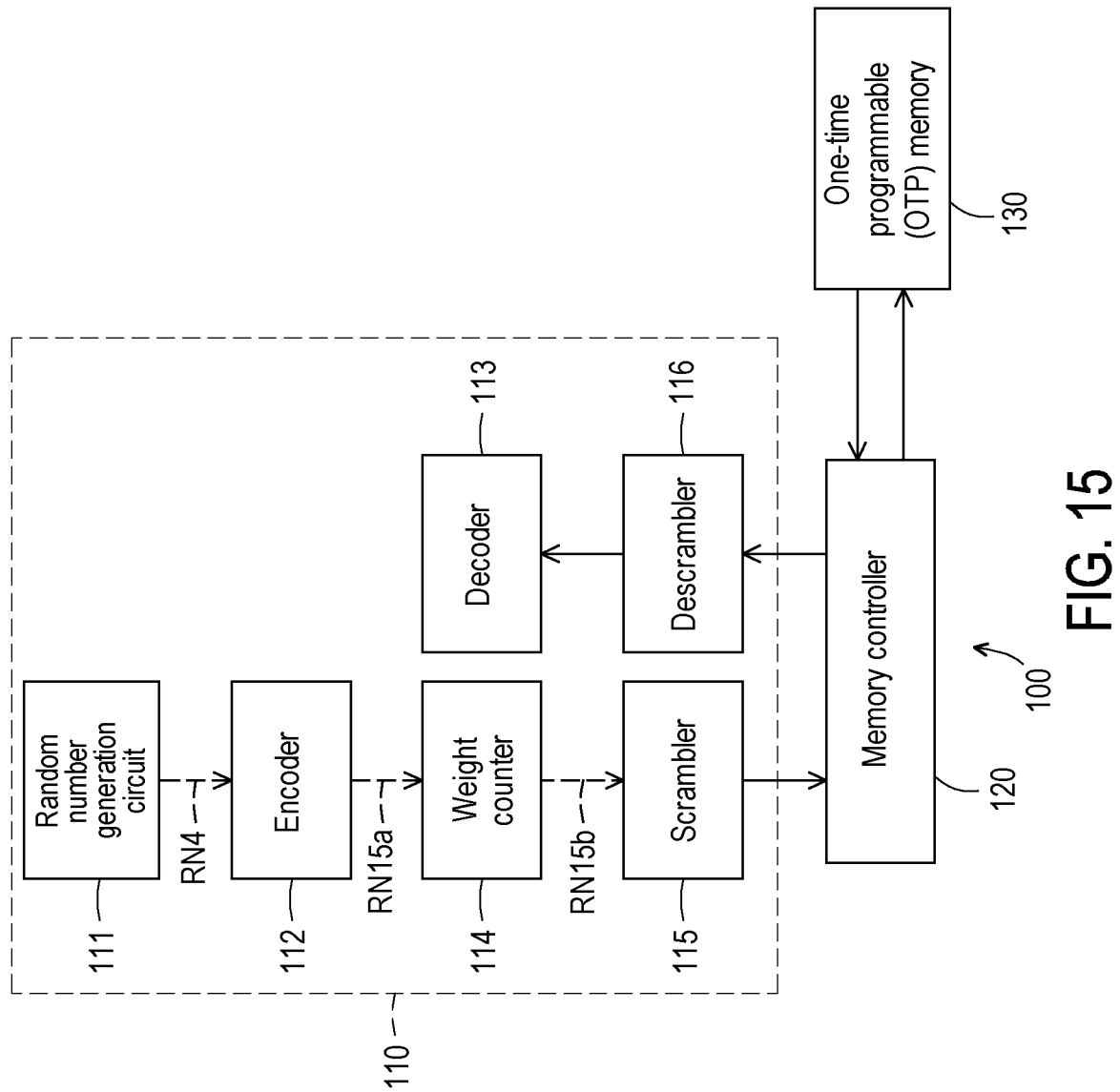
FIG. 15 is a schematic circuit block diagram of an identifier generation circuit according to another embodiment of the disclosure.

FIG. 15 is a schematic circuit block diagram of an identifier generation circuit 110 according to another embodiment of the disclosure. The identifier generation circuit 110 shown in FIG. 15 includes a random number generation circuit 111, an encoder 112, a decoder 113, a weight counter 114, a scrambler 115 and a descrambler 116. The random number generation circuit 111, the encoder 112 and the decoder 113 shown in FIG. 15 can be inferred from the related descriptions of the random number generation circuit 111, the encoder 112 and the decoder 113 shown in FIG. 4; the weight counter 114 shown in FIG. 15 can be inferred from the related descriptions of the weight counter 114 shown in FIG. 7; and the scrambler 115 and the descrambler 116 shown in FIG. 15 can be inferred from the related descriptions of the scrambler 115 and the descrambler 116 shown in FIG. 11, so further explanations are omitted here. In the embodiment shown in FIG. 15, the encoder 112 is coupled to the random number generation circuit 111 to receive the random number RN4. The encoder 112 performs an encoding operation on the random number RN4 to generate an error-detection code, and outputs the error-detection code and the random number RN4 to the weight counter 114 as an original identifier RN15*a*. The weight counter 114 is coupled to the encoder 112. The weight counter 114 calculates the Hamming weight of the original identifier RN15a, and inspects whether the Hamming weight of the original identifier RN15a falls within a certain proportional range (e.g. 45%-55%).

Figure 16:
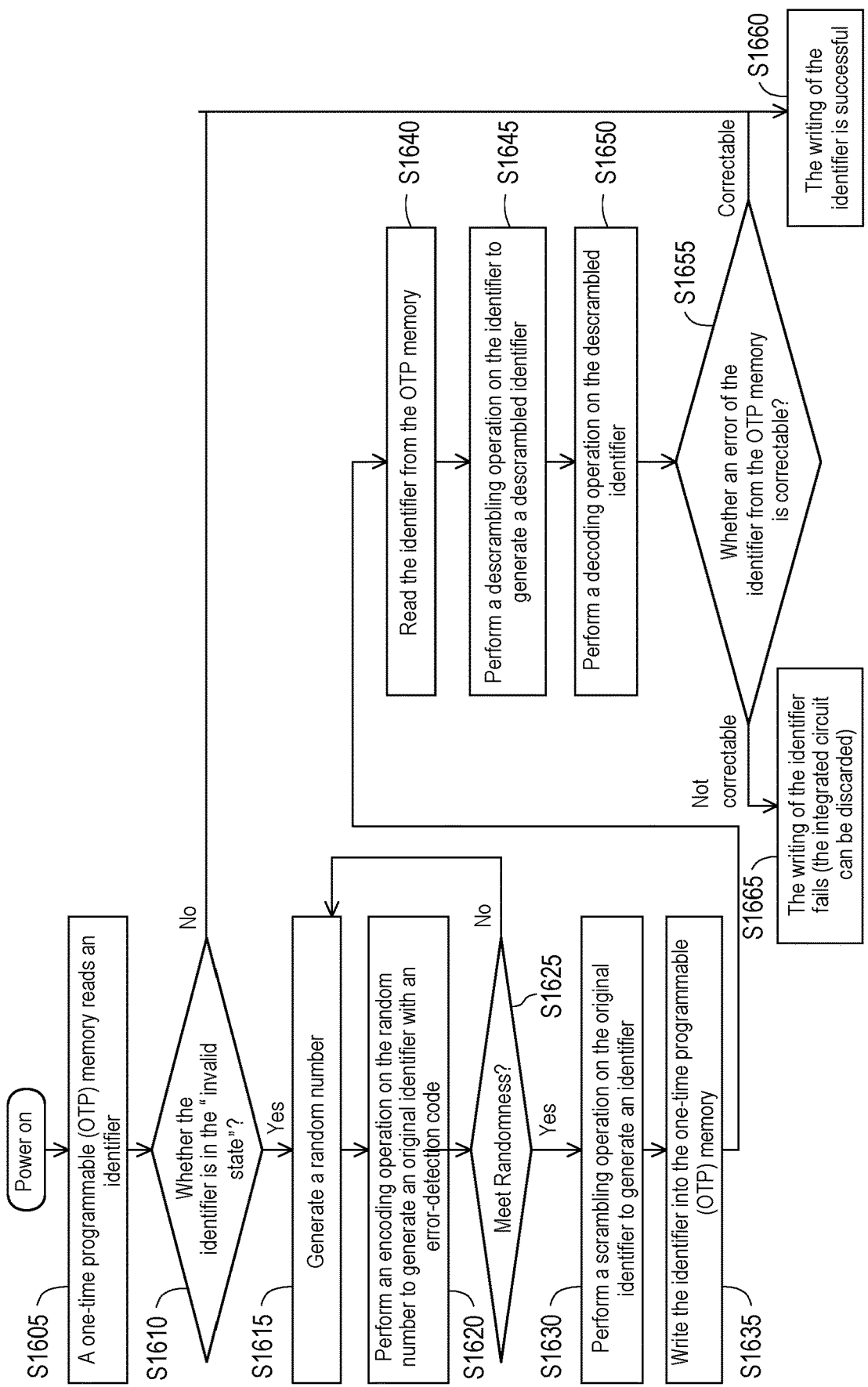
FIG. 16 is a schematic flowchart of an operation method of an integrated circuit according to yet another embodiment of the disclosure.

FIG. 16 is a schematic flowchart of an operation method of an integrated circuit according to yet another embodiment of the disclosure. Steps S1605, S1610 and S1615 shown in FIG. 16 can be inferred from the related descriptions of steps S610, S620 and S630 shown in FIG. 6; and steps S1620 and S1625 shown in FIG. 16 can be inferred from the related descriptions of steps S1020 and S1025 shown in FIG. 10, so further explanations are omitted here. Please refer to FIG. 15 and FIG. 16. In step S1625, the weight counter 114 inspects whether the randomness of the original identifier RN15a provided by the encoder 112 meets the rated requirement. For example, the weight counter 114 inspects whether the Hamming weight of the original identifier RN15a falls within a certain proportional range (e.g. 45%-55%). When the Hamming weight falls outside the proportional range (the result determined in step S1625 is "No"), the weight counter 114 notifies the random number generation circuit 111 to regenerate a new random number RN4, and the encoder 112 to regenerate a new error-detection code and a new original identifier RN15a, until the Hamming weight of the original identifier RN15a falls within the proportional range. When the Hamming weight of the original identifier RN15a falls within the proportional range (the result determined in step S1625 is "Yes"), the weight counter 114 outputs the original identifier RN15a as an original identifier RN15b to the scrambler 115, and then the identifier generation circuit 110 proceeds to step S1630. However, the weight counter 114 is not limited to calculating the Hamming weight, as described above.

The scrambler 115 is coupled to the encoder 112 to receive the original identifier RN15b. In step S1630, the scrambler 115 performs a scrambling operation on the original identifier RN15b to generate an identifier to the memory controller 120. Steps S1630, S1635, S1640, S1645, S1650, S1655, S1660, and S1665 shown in FIG. 16 can be inferred from the related descriptions of steps S1225, S1230, S1235, S1240, S1245, S1250, S1255, and S1260 shown in FIG. 12, so further explanations are omitted here.

Figure 17:
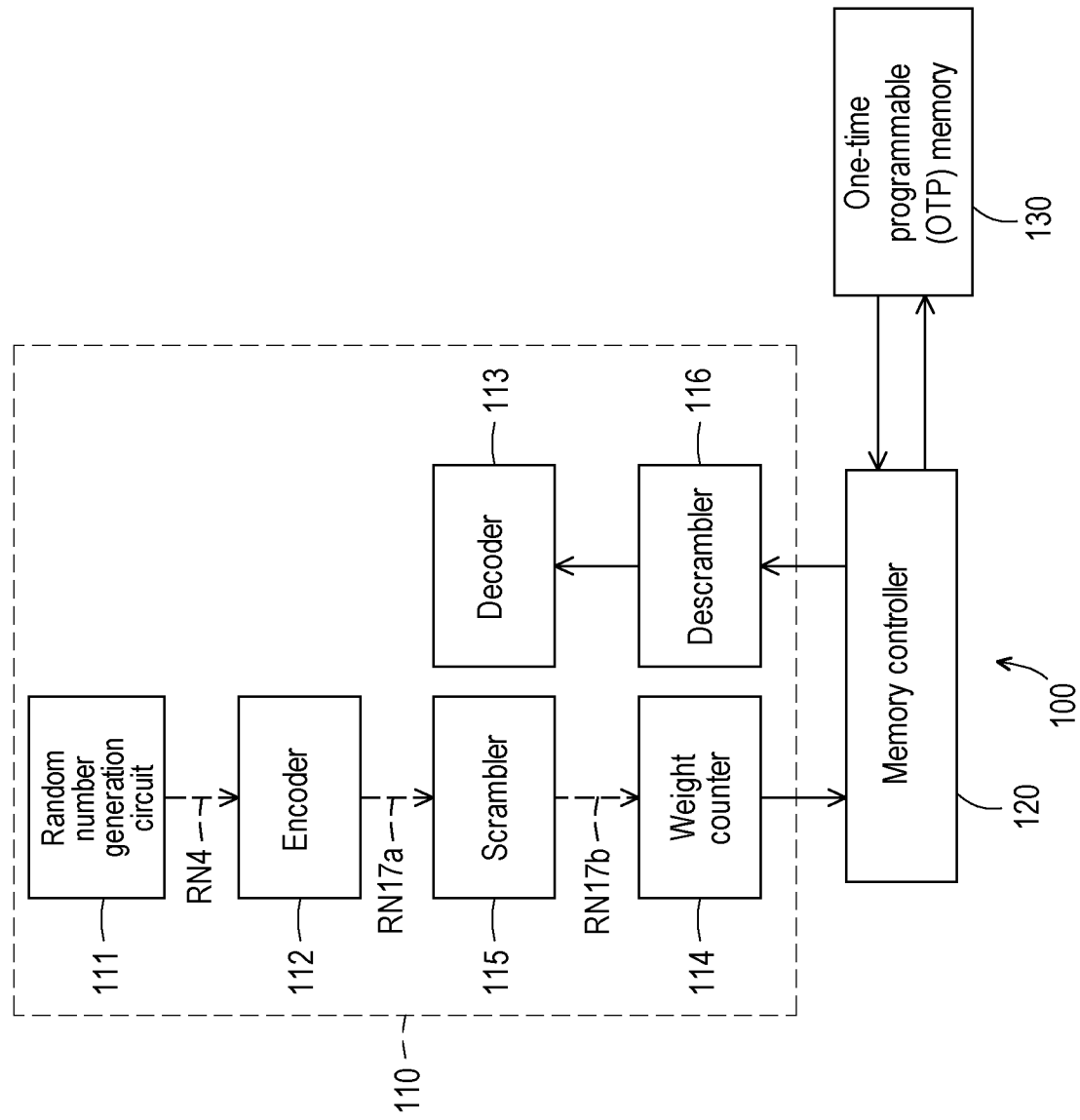
FIG. 17 is a schematic circuit block diagram of an identifier generation circuit according to another embodiment of the disclosure.

FIG. 17 is a schematic circuit block diagram of an identifier generation circuit 110 according to another embodiment of the disclosure. The identifier generation circuit 110 shown in FIG. 17 includes a random number generation circuit 111, an encoder 112, a decoder 113, a weight counter 114, a scrambler 115 and a descrambler 116. The random number generation circuit 111, the encoder 112 and the decoder 113 shown in FIG. 17 can be inferred from the related descriptions of the random number generation circuit 111, the encoder 112 and the decoder 113 shown in FIG. 4; the weight counter 114 shown in FIG. 17 can be inferred from the related descriptions of the weight counter 114 shown in FIG. 9; and the scrambler 115 and the descrambler 116 shown in FIG. 17 can be inferred from the related descriptions of the scrambler 115 and the descrambler 116 shown in FIG. 11, so further explanations are omitted here.

In the embodiment shown in FIG. 17, the encoder 112 is coupled to the random number generation circuit 111 to receive a random number RN4. The encoder 112 performs an encoding operation on the random number RN4 to generate an error-detection code, and outputs the error-detection code and the random number RN4 to the scrambler 115 as an original identifier RN17a. The scrambler 115 is coupled to the encoder 112 to receive the original identifier RN17a. The scrambler 115 performs a scrambling operation on the original identifier RN17a to generate an identifier RN17b. The weight counter 114 is coupled to the scrambler 115 to receive the identifier RN17b. The weight counter 114 calculates the Hamming weight of the identifier RN17b, and inspects whether the Hamming weight of the identifier RN17b falls within a certain proportional range (e.g. 45%-55%). However, the weight counter 114 is not limited to calculating the Hamming weight, as described above.

Figure 18:
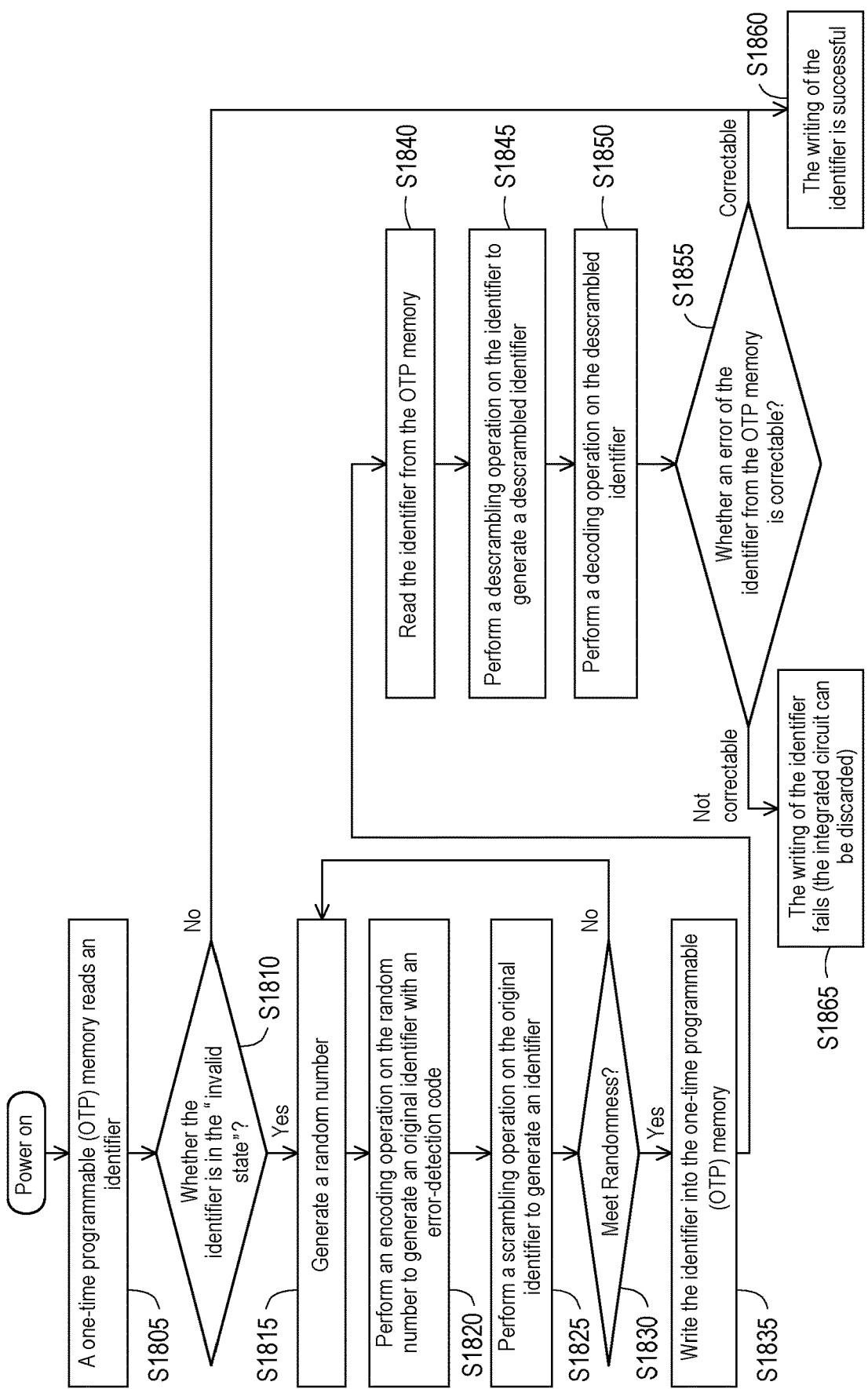
FIG. 18 is a schematic flowchart of an operation method of an integrated circuit according to a further embodiment of the disclosure.

FIG. 18 is a schematic flowchart of an operation method of an integrated circuit according to a further embodiment of the disclosure. Steps S1805, S1810 and S1815 shown in FIG. 18 can be inferred from the related descriptions of steps S610, S620 and S630 shown in FIG. 6; and steps S1820 and S1825 shown in FIG. 18 can be inferred from the related descriptions of steps S1220 and S1225 shown in FIG. 12, so further explanations are omitted here. Please refer to FIG. 17 and FIG. 18. In step S1830, the weight counter 114 inspects whether the randomness of the identifier RN17b provided by the scrambler 115 meets the rated requirement. For example, the weight counter 114 inspects whether the Hamming weight of the identifier RN17b falls within a certain proportional range (e.g. 45%-55%).

When the Hamming weight of the identifier RN17b falls within the proportional range (the result determined in step S1830 is "Yes"), the weight counter 114 outputs the identifier RN17b to a memory controller 120, so that the memory controller 120 writes the identifier provided by the weight counter 114 into the OTP memory 130 (step S1835). When the Hamming weight of the identifier RN17b falls outside the proportional range (the result determined in step S1625 is "No"), the weight counter 114 notifies the random number generation circuit 111 to regenerate the random number RN4 (returning to step S1815), the encoder 112 to regenerate the error-detection code and the original identifier RN17a (step S1820), and the scrambler 115 to regenerate the identifier RN17b (step S1825), until the Hamming weight of the identifier RN17b falls within the proportional range. The weight counter 114 then outputs the identifier RN17b to the memory controller 120 (proceeding then to step S1835).

The memory controller 120 is coupled to the weight counter 114 to receive the identifier. In step S1835, the memory controller 120 writes the identifier provided by the weight counter 114 into the OTP memory 130. Steps S1835, S1840, S1845, S1850, S1855, S1860 and S1865 shown in FIG. 18 can be inferred from the related descriptions of steps S1230, S1235, S1240, S1245, S1250, S1255 and S1260 shown in FIG. 12, so further explanations are omitted here.

According to different design requirements, the identifier generation circuit 110, the random number generation circuit 111, the encoder 112, the decoder 113, the weight counter 114, the scrambler 115, the descrambler 116 and/or the memory controller 120 can be implemented in the form of hardware, firmware, software (that is, a program) or a combination of any of the foregoing three forms. In the form of hardware, the identifier generation circuit 110, the random number generation circuit 111, the encoder 112, the decoder 113, the weight counter 114, the scrambler 115, the descrambler 116 and/or the memory controller 120 are implemented as logic circuits on an integrated circuit. The associated functions of the identifier generation circuit 110, the random number generation circuit 111, the encoder 112, the decoder 113, the weight counter 114, the scrambler 115, the descrambler 116 and/or the memory controller 120 are implemented as hardware using hardware description languages (such as Verilog HDL or VHDL) or other suitable programming languages. For example, the associated functions of the identifier generation circuit 110, the random number generation circuit 111, the encoder 112, the decoder 113, the weight counter 114, the scrambler 115, the descrambler 116 and/or the memory controller 120 are implemented in one or more controller(s), microcontroller(s), microprocessor(s), application-specific integrated circuit(s) (ASICs), digital signal processor(s) (DSPs), Field Programmable Gate Array(s) (FPGAs) and/or various logic blocks, modules and circuits in other processing units.

In the form of software and/or firmware, the associated functions of the identifier generation circuit 110, the random number generation circuit 111, the encoder 112, the decoder 113, the weight counter 114, the scrambler 115, the descrambler 116 and/or the memory controller 120 are implemented as programming codes. For example, the identifier generation circuit 110, the random number generation circuit 111, the encoder 112, the decoder 113, the weight counter 114, the scrambler 115, the descrambler 116 and/or the memory controller 120 are implemented using general programming languages (such as C, C++, or a combination of these languages) or other suitable programming languages. The programming codes may be recorded/stored in a "non-transitory computer readable medium." Central Processing Unit(s) (CPUs), controller(s), microcontroller(s) or microprocessor(s) may read and execute the programming codes from the non-transitory computer readable medium, thereby implementing the associated functions of the identifier generation circuit 110, the random number generation circuit 111, the encoder 112, the decoder 113, the weight counter 114, the scrambler 115, the descrambler 116 and/or the memory controller 120.

To sum up, the integrated circuit 100 and the operation method thereof according to some embodiments of the disclosure perform an error-detection-code encoding operation on the random number to generate an error-detection code. In some embodiments, the error-detection code includes an error-correcting code (ECC) or a Hamming code with additional parity (e.g. [8,4] Hamming, [72,64] Hamming, or other Hamming codes). The identifier with the error-detection code is written into the OTP memory 130 of the integrated circuit 100. In addition, the integrated circuit 100 inspects whether the identifier from the OTP memory 130 is valid (is correctable). When the error of the identifier from the OTP memory 130 is not correctable, the writing of the identifier fails, so the integrated circuit 100 can be discarded.

Although the disclosure has been described with reference to the embodiments above, the embodiments are not intended to limit the disclosure. It will be apparent to those skilled in the art that various modifications and variations can be made to the disclosure without departing from the scope or spirit of the disclosure. In view of the foregoing, it is intended that the disclosure covers modifications and variations provided that they fall within the scope of the following claims and their equivalents.

What is claimed is:

1. An integrated circuit, comprising:
    a one-time programmable (OTP) memory;
    an identifier generation circuit for generating a random number and performing an error-detection-code encoding operation on the random number to generate an identifier with an error-detection code, wherein the identifier generation circuit includes a weight counter for calculating a weight of the random number and inspecting the weight, when the weight falls within a proportional range, the identifier generation circuit performs the error-detection-code encoding operation on the random number to generate the error-detection code, and when the weight falls outside the proportional range, the identifier generation circuit regenerates the random number until the weight of the random number falls within the proportional range; and
    a memory controller, coupled to the one-time programmable (OTP) memory and the identifier generation circuit, for writing the identifier generated by the identifier generation circuit into the one-time programmable (OTP) memory.

2. The integrated circuit according to claim 1, wherein the error-detection code comprises an error-correcting code (ECC) or a Hamming code with additional parity.

3. The integrated circuit according to claim 2, wherein the Hamming code comprises a [8,4] Hamming code or a [72,64] Hamming code.

4. The integrated circuit according to claim 1, wherein the identifier generation circuit further comprises:
    a random number generation circuit for generating the random number to the weight counter, wherein when the weight falls within the proportional range, the weight counter outputs the random number, and when the weight falls outside the proportional range, the weight counter notifies the random number generation circuit to regenerate the random number until the weight of the random number falls within the proportional range, and the weight counter then outputs the random number; and
    an encoder, coupled to the weight counter to receive the random number, for performing an encoding operation on the random number to generate the error-detection code and outputting the error-detection code and the random number as the identifier to the memory controller.

5. The integrated circuit according to claim 4, wherein the random number generation circuit comprises a true random number generator (TRNG) or a pseudo-random number generator (PRNG) for generating the random number.

6. The integrated circuit according to claim 4, wherein the random number generation circuit comprises:
    a true random number generator (TRNG) for generating an unpredictable seed value; and
    a pseudo-random number generator (PRNG) coupled to the true random number generator (TRNG) to receive the unpredictable seed value and use the unpredictable seed value to generate the random number.

7. The integrated circuit according to claim 1, wherein the identifier generation circuit further comprises:
    a random number generation circuit for generating the random number; and
    an encoder, coupled to the random number generation circuit to receive the random number, for performing an encoding operation on the random number to generate the error-detection code and using the error-detection code and the random number as the identifier,
    wherein the weight counter is coupled to the encoder for calculating the weight and inspecting the weight, when the weight falls within the proportional range, the weight counter outputs the identifier to the memory controller, and when the weight falls outside the proportional range, the weight counter notifies the random number generation circuit to regenerate the random number, and notifies the encoder to regenerate the error-detection code and the identifier until the weight of the identifier falls within the proportional range, and the weight counter then outputs the identifier to the memory controller.

8. The integrated circuit according to claim 1, wherein the identifier generation circuit further comprises:
- a random number generation circuit for generating the random number to the weight counter, wherein when the weight falls within the proportional range, the weight counter outputs the random number, and when the weight falls outside the proportional range, the weight counter notifies the random number generation circuit to regenerate the random number until the weight falls within the proportional range, and the weight counter then outputs the random number;
- an encoder, coupled to the weight counter to receive the random number, for performing an encoding operation on the random number to generate the error-detection code and using the error-detection code and the random number as an original identifier; and
- a scrambler, coupled to the encoder, for performing a scrambling operation on the original identifier to generate the identifier to the memory controller.

9. The integrated circuit according to claim 1, wherein the identifier generation circuit further comprises:
- a random number generation circuit for generating the random number;
- an encoder, coupled to the random number generation circuit to receive the random number, for performing an encoding operation on the random number to generate the error-detection code and using the error-detection code and the random number as an original identifier, wherein the weight counter is coupled to the encoder, the weight counter calculates the weight of the original identifier and inspects the weight, when the weight falls within the proportional range, the weight counter outputs the original identifier, and when the weight falls outside the proportional range, the weight counter notifies the random number generation circuit to regenerate the random number, and notifies the encoder to regenerate the error-detection code and the original identifier until the weight of the original identifier falls within the proportional range, and the weight counter then outputs the original identifier; and
- a scrambler, coupled to the weight counter to receive the original identifier, for performing a scrambling operation on the original identifier to generate the identifier to the memory controller.

10. The integrated circuit according to claim 1, wherein the identifier generation circuit further comprises:
- a random number generation circuit for generating the random number;
- an encoder, coupled to the random number generation circuit to receive the random number, for performing an encoding operation on the random number to generate the error-detection code, and using the error-detection code and the random number as an original identifier; and
- a scrambler, coupled to the encoder to receive the original identifier, for performing a scrambling operation on the original identifier to generate the identifier, wherein the weight counter is coupled to the scrambler to receive the identifier, the weight counter calculates the weight of the identifier and inspects the weight, when the weight falls within the proportional range, the weight counter outputs the identifier to the memory controller, and when the weight falls outside the proportional range, the weight counter notifies the random number generation circuit to regenerate the random number, notifies the encoder to regenerate the error-detection code and the original identifier, and notifies the scrambler to regenerate the identifier until the weight of the identifier falls within the proportional range, and the weight counter then outputs the identifier to the memory controller.

11. The integrated circuit according to claim 1, wherein after being powered on, the identifier generation circuit reads the identifier from the one-time programmable (OTP) memory through the memory controller, and the identifier generation circuit inspects whether the identifier is in an invalid state.

12. The integrated circuit according to claim 1, wherein the memory controller reads the identifier from the one-time programmable (OTP) memory to provide to the identifier generation circuit, and the identifier generation circuit performs an error-detection-code decoding operation on the identifier provided by the memory controller to determine whether an error of the identifier from the one-time programmable (OTP) memory is correctable.

13. The integrated circuit according to claim 12, wherein the identifier generation circuit comprises:
- a decoder, coupled to the memory controller to receive the identifier, for performing a decoding operation on the identifier using the error-detection code in the identifier to determine whether the error of the identifier from the one-time programmable (OTP) memory is correctable.

14. The integrated circuit according to claim 12, wherein the identifier generation circuit comprises:
- a descrambler, coupled to the memory controller to receive the identifier, for performing a descrambling operation on the identifier to generate a descrambled identifier; and
- a decoder, coupled to the descrambler to receive the descrambled identifier, for performing a decoding operation on the descrambled identifier using the error-detection code in the descrambled identifier to determine whether the error of the identifier from the one-time programmable (OTP) memory is correctable.

15. The integrated circuit according to claim 12, wherein when determining that the error of the identifier from the one-time programmable (OTP) memory is not correctable, writing of the identifier is deemed failed.

16. An operation method of an integrated circuit, comprising:
- generating a random number;
- calculating a weight of the random number; and
- inspecting the weight,
- regenerating the random number until the weight of the random number falls within the proportional range when the weight falls outside a proportional range;
- performing an error-detection-code encoding operation on the random number when the weight falls within the proportional range to generate an identifier with an error-detection code; and
- writing the identifier into a one-time programmable (OTP) memory of the integrated circuit.

17. The operation method of the integrated circuit according to claim 16, wherein the error-detection code comprises an error-correcting code (ECC) or a Hamming code with additional parity.

18. The operation method of the integrated circuit according to claim 17, wherein the Hamming code comprises a [8,4] Hamming code or a [72,64] Hamming code.

19. The operation method of the integrated circuit according to claim 16, wherein generating the random number comprises:

generating an unpredictable seed value by a true random number generator (TRNG); and generating the random number by a pseudo-random number generator (PRNG) using the unpredictable seed value.

20. The operation method of the integrated circuit according to claim 16, wherein the error-detection-code encoding operation comprises:

performing an encoding operation on the random number when the weight falls within the proportional range to generate the error-detection code;

regenerating the random number when the weight falls outside the proportional range until the weight of the random number falls within the proportional range to perform an encoding operation on the random number to generate the error-detection code; and using the error-detection code and the random number as the identifier.

21. The operation method of the integrated circuit according to claim 16, wherein the error-detection-code encoding operation comprises:

performing an encoding operation on the random number to generate the error-detection code;

using the error-detection code and the random number as the identifier;

calculating the weight of the identifier;

writing the identifier into the one-time programmable (OTP) memory when the weight falls within the proportional range; and regenerating the random number, the error-detection code and the identifier when the weight falls outside the proportional range until the weight of the identifier falls within the proportional range, and then writing the identifier into the one-time programmable (OTP) memory.

22. The operation method of the integrated circuit according to claim 16, wherein the error-detection-code encoding operation comprises:

performing an encoding operation on the random number when the weight falls within a proportional range to generate the error-detection code;

regenerating the random number when the weight falls outside the proportional range until the weight of the random number falls within the proportional range to perform an encoding operation on the random number to generate the error-detection code;

using the error-detection code and the random number as an original identifier; and performing a scrambling operation on the original identifier to generate the identifier.

23. The operation method of the integrated circuit according to claim 16, wherein the error-detection-code encoding operation comprises:

performing an encoding operation on the random number to generate the error-detection code;

using the error-detection code and the random number as an original identifier;

calculating the weight of the original identifier;

performing a scrambling operation on the original identifier when the weight falls within the proportional range to generate the identifier; and regenerating the random number, the error-detection code and the original identifier when the weight falls outside the proportional range until the weight of the original identifier falls within the proportional range to perform a scrambling operation on the original identifier to generate the identifier.

24. The operation method of the integrated circuit according to claim 16, wherein the error-detection-code encoding operation comprises:

performing an encoding operation on the random number to generate the error-detection code;

using the error-detection code and the random number as an original identifier;

performing a scrambling operation on the original identifier to generate the identifier;

calculating the weight of the identifier;

writing the identifier into the one-time programmable (OTP) memory when the weight falls within the proportional range; and regenerating the random number, the error-detection code, the original identifier and the identifier when the weight falls outside the proportional range until the weight of the identifier falls within the proportional range, and then writing the identifier into the one-time programmable (OTP) memory.

25. The operation method of the integrated circuit according to claim 16, further comprising:

reading the identifier from the one-time programmable (OTP) memory after powering on; and inspecting whether the identifier is in an invalid state.

26. The operation method of the integrated circuit according to claim 16, further comprising:

reading the identifier from the one-time programmable (OTP) memory; and performing an error-detection-code decoding operation on the identifier to determine whether an error of the identifier from the one-time programmable (OTP) memory is correctable.

27. The operation method of the integrated circuit according to claim 26, wherein the error-detection-code decoding operation comprises:

performing a decoding operation on the identifier using the error-detection code in the identifier to determine whether the error of the identifier from the one-time programmable (OTP) memory is correctable.

28. The operation method of the integrated circuit according to claim 26, wherein the error-detection-code decoding operation comprises:

performing a descrambling operation on the identifier to generate a descrambled identifier; and performing a decoding operation on the descrambled identifier using the error-detection code in the descrambled identifier to determine whether the error of the identifier from the one-time programmable (OTP) memory is correctable.

29. The operation method of the integrated circuit according to claim 26, further comprising:

regarding writing of the identifier as failed when determining that the error of the identifier from the one-time programmable (OTP) memory is not correctable.

30. An inspection method of an integrated circuit, comprising:

reading an identifier with an error-detection code from a one-time programmable (OTP) memory of the integrated circuit; and performing an error-detection-code decoding operation on the identifier to determine whether an error of the identifier from the one-time programmable (OTP) memory is correctable, wherein the error-detection-code decoding operation comprises:

performing a descrambling operation on the identifier to generate a descrambled identifier; and performing a decoding operation on the descrambled identifier using the error-detection code in the descrambled identifier to determine whether the error of the identifier from the one-time programmable (OTP) memory is correctable.

31. The inspection method of the integrated circuit according to claim 30, further comprising:
regarding writing of the identifier as failed when determining that the error of the identifier from the one-time programmable (OTP) memory is not correctable.

* * * * *